US012684853B2

(12) United States Patent
Saitoh et al.

(10) Patent No.: US 12,684,853 B2
(45) Date of Patent: Jul. 14, 2026

(54) SILICON CARBIDE SEMICONDUCTOR DEVICE

(71) Applicant: SUMITOMO ELECTRIC INDUSTRIES, LTD., Osaka (JP)

(72) Inventors: Yu Saitoh, Osaka (JP); Takeyoshi Masuda, Osaka (JP)

(73) Assignee: MITSUMI ELECTRIC CO., LTD., Tokyo (JP)

( * ) Notice: Subject to any disclaimer, the term of this patent is extended or adjusted under 35 U.S.C. 154(b) by 356 days.

(21) Appl. No.: 18/690,444

(22) PCT Filed: Oct. 14, 2022

(86) PCT No.: PCT/JP2022/038403

§ 371 (c)(1),
(2) Date: Mar. 8, 2024

(87) PCT Pub. No.: WO2023/100500

PCT Pub. Date: Jun. 8, 2023

(65) Prior Publication Data

US 2025/0133805 A1    Apr. 24, 2025

(30) Foreign Application Priority Data

Nov. 30, 2021    (JP) ................................. 2021-193786

(51) Int. Cl.
| | |
|---|---|
| *H10D 64/27* | (2025.01) |
| *H10D 30/66* | (2025.01) |
| *H10D 62/832* | (2025.01) |

(52) U.S. Cl.
CPC ......... *H10D 64/518* (2025.01); *H10D 30/668* (2025.01); *H10D 64/513* (2025.01); *H10D 62/8325* (2025.01)

(58) Field of Classification Search
CPC .. H10D 64/518; H10D 30/668; H10D 64/513; H10D 62/8325
See application file for complete search history.

(56) References Cited

U.S. PATENT DOCUMENTS

| | | | |
|---|---|---|---|
| 2013/0307061 A1 | 11/2013 | Masuda et al. | |
| 2015/0236127 A1 | 8/2015 | Miyahara et al. | |

(Continued)

FOREIGN PATENT DOCUMENTS

| | | |
|---|---|---|
| JP | 2013-243188 | 12/2013 |
| JP | 2014-053595 | 3/2014 |

(Continued)

*Primary Examiner* — Thao P Le
(74) *Attorney, Agent, or Firm* — IPUSA, PLLC

(57) ABSTRACT

A silicon carbide semiconductor device includes a silicon carbide substrate having a first main surface. The first main surface is provided with a gate trench. A contour of the gate trench on the first main surface is curved along a third side surface and a fourth side surface, and a contour of the gate trench in a cross section includes a first local minimum point at which a radius of curvature is a local minimum at a boundary between a first side surface and the third side surface, a second local minimum point at which a radius of curvature is a local minimum at a boundary between a second side surface and the fourth side surface, and a third local minimum point at which a radius of curvature is a local minimum at a boundary between the third side surface and the fourth side surface.

9 Claims, 22 Drawing Sheets

(56)                    References Cited

U.S. PATENT DOCUMENTS

| | | | |
|---|---|---|---|
| 2015/0357415 A1 | 12/2015 | Kagawa et al. | |
| 2016/0240656 A1 | 8/2016 | Masuda | |
| 2019/0288106 A1* | 9/2019 | Uchida | H10D 62/127 |
| 2021/0399090 A1 | 12/2021 | Uchida et al. | |
| 2022/0384566 A1* | 12/2022 | Saitoh | H10D 30/668 |
| 2024/0038835 A1* | 2/2024 | Zhang | H10D 12/481 |
| 2024/0204096 A1* | 6/2024 | Otsuji | H10D 62/105 |
| 2024/0266401 A1* | 8/2024 | Qi | H10D 30/668 |
| 2025/0015176 A1* | 1/2025 | Nagata | H10D 62/127 |
| 2025/0063775 A1* | 2/2025 | Hell | H10D 62/111 |
| 2025/0120120 A1* | 4/2025 | Narita | H10D 30/668 |
| 2025/0185312 A1* | 6/2025 | Martinez-Limia | H10D 30/0297 |
| 2025/0234630 A1* | 7/2025 | Kim | H10D 30/0297 |
| 2025/0331226 A1* | 10/2025 | Ma | H10D 62/292 |
| 2025/0359143 A1* | 11/2025 | Leendertz | H10D 30/662 |
| 2025/0393269 A1* | 12/2025 | Noborio | H10D 30/668 |

FOREIGN PATENT DOCUMENTS

| | | |
|---|---|---|
| JP | 2015-072944 | 4/2015 |
| JP | 2020-031157 | 2/2020 |
| JP | 2020-127023 | 8/2020 |
| WO | 2014/122919 | 8/2014 |
| WO | 2019/155783 | 8/2019 |

* cited by examiner

Z1

Z2

Z1

Z2

SILICON CARBIDE SEMICONDUCTOR DEVICE

TECHNICAL FIELD

The present disclosure relates to a silicon carbide semiconductor device.

This application is based upon and claims priority of Japanese Patent Application No. 2021-193786, filed Nov. 30, 2021, the entire contents of which are incorporated herein by reference.

BACKGROUND ART

A silicon carbide semiconductor device is disclosed in which a gate electrode is formed inside a trench formed in a substrate via a gate insulating film.

RELATED ART DOCUMENTS

Patent Documents

Patent Document 1: Japanese Unexamined Patent Application Publication No. 2014-053595
Patent Document 2: WO2014/122919

SUMMARY OF THE INVENTION

A silicon carbide semiconductor device in the present disclosure includes a silicon carbide substrate having a first main surface, the silicon carbide substrate including a drift region having a first type conductivity, a body region having a second type conductivity different from the first type conductivity, the body region being provided on the drift region, and a source region having the first type conductivity, the source region being provided on the body region so as to be separated from the drift region. The first main surface is provided with a gate trench defined by side surfaces penetrating both the source region and the body region to reach the drift region and a bottom surface continuous with the side surfaces, the gate trench being extended in a first direction parallel to the first main surface. A gate insulating film in contact with the side surfaces, the bottom surface, and the first main surface is further provided, and the side surfaces include a first side surface extending in the first direction; a second side surface extending in the first direction, the second side surface being away from the first side surface in a second direction that is parallel to the first main surface and perpendicular to the first direction; a third side surface continuous with the first side surface; and a fourth side surface continuous with the second side surface and the third side surface. A contour of the gate trench on the first main surface is curved along the third side surface and the fourth side surface, and a contour of the gate trench in a cross section parallel to the first main surface includes a first local minimum point at which a radius of curvature is a local minimum at a boundary between the first side surface and the third side surface;

a second local minimum point at which a radius of curvature is a local minimum at a boundary between the second side surface and the fourth side surface; and a third local minimum point at which a radius of curvature is a local minimum at a boundary between the third side surface and the fourth side surface.

MODE FOR CARRYING OUT THE INVENTION

Figure 1:
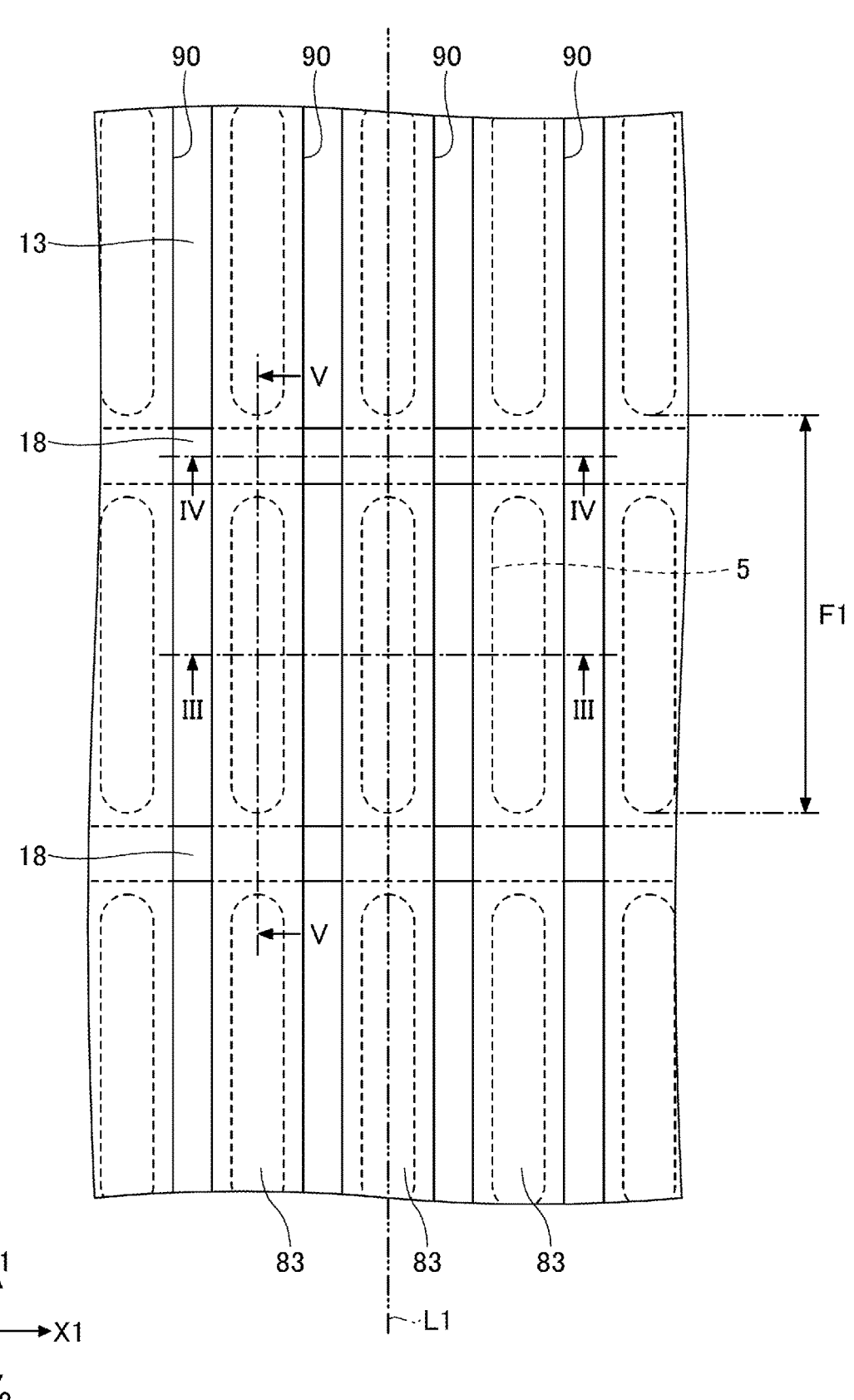
FIG. 1 is a diagram illustrating the configuration of interlayer insulating films and a first main surface in a silicon carbide semiconductor device according to an embodiment.

Problem to be Solved by the Present Disclosure

In a conventional silicon carbide semiconductor device, it has been difficult to achieve both channel characteristics and long-term reliability of a gate insulating film.

An object of the present disclosure is to provide a silicon carbide semiconductor device capable of achieving both channel characteristics and long-term reliability of a gate insulating film.

Effects of the Present Disclosure

In the present disclosure, both channel characteristics and long-term reliability of a gate insulating film can be achieved.

Hereinafter, embodiments will be described.

Description of the Embodiments of the Present Disclosure

The embodiments of the present disclosure will be listed and described. In the following description, the same or corresponding elements are denoted by the same reference numerals, and the same description thereof will not be repeated. Regarding crystallographic indications in the present specification, an individual orientation is represented by [ ], a group orientation is represented by < >, an individual plane is represented by ( ), and a group plane is represented by { }. A crystallographically negative index is generally expressed by placing "-" (bar) on top of a number, but in the present specification, a negative sign is placed before the number. Further, in the present disclosure, an X1-X2 direction, a Y1-Y2 direction, and a Z1-Z2 direction are directions orthogonal to one another. A plane including the X1-X2 direction and the Y1-Y2 direction is referred to as an XY plane, a plane including the Y1-Y2 direction and the Z1-Z2 direction is referred to as a YZ plane, and a plane including the Z1-Z2 direction and the X1-X2 direction is referred to as a ZX plane. For the sake of simplicity, the Z1-Z2 direction is defined as a vertical direction, a Z1 side is defined as an upper side, and a Z2 side is defined as a lower side. A plan view means that an object is viewed from the Z1 side, and a plan shape means a shape of the object viewed from the Z1 side.

[1] A silicon carbide semiconductor device in one aspect of the present disclosure includes a silicon carbide substrate having a first main surface, the silicon carbide substrate including: a drift region having a first type conductivity; a body region having a second type conductivity different from the first type conductivity, the body region being provided on the drift region; and a source region having the first type conductivity, the source region being provided on the body region so as to be separated from the drift region. The first main surface is provided with a gate trench defined by side surfaces penetrating both the source region and the body region to reach the drift region and a bottom surface continuous with the side surfaces, the gate trench being extended in a first direction parallel to the first main surface. A gate insulating film in contact with the side surfaces, the bottom surface, and the first main surface is further provided. The side surfaces include a first side surface extending in the first direction; a second side surface extending in the first direction, the second side surface being away from the first side surface in a second direction that is parallel to the first main surface and perpendicular to the first direction; a third side surface continuous with the first side surface; and a fourth side surface continuous with the second side surface and the third side surface. A contour of the gate trench on the first main surface is curved along the third side surface and the fourth side surface, and a contour of the gate trench in a cross section parallel to the first main surface includes a first local minimum point at which a radius of curvature is a local minimum at a boundary between the first side surface and the third side surface; a second local minimum point at which a radius of curvature is a local minimum at a boundary between the second side surface and the fourth side surface; and a third local minimum point at which a radius of curvature is a local minimum at a boundary between the third side surface and the fourth side surface.

The contour of the gate trench on the first main surface is curved along the third side surface and the fourth side surface. With this arrangement, field concentration on the gate insulating film near a boundary between the first main surface and both the third side surface and the fourth side surface is alleviated, and thus the gate insulating film can have excellent long-term reliability. The contour of the gate trench in the cross section parallel to the first main surface has the first local minimum point, the second local minimum point, and the third local minimum point. With this arrangement, surfaces of the body region exposed at the third side surface and the fourth side surface can have characteristics similar to those of a crystal plane in which excellent channel characteristics can easily be obtained. Thus, excellent channel characteristics can be obtained also on the third side surface and the fourth side surface. As a result, both the channel characteristics and the long-term reliability of the gate insulating film can be achieved.

[2] In [1], a distance between the first local minimum point and the third local minimum point and a distance between the second local minimum point and the third local minimum point may decrease as the cross section approaches the bottom surface. In such a case, surfaces of the body region exposed at the third side surface and the fourth side surface can easily have characteristics similar to those of a crystal plane in which excellent channel characteristics can easily be obtained. Thus, excellent channel characteristics can easily be obtained also on the third side surface and the fourth side surface.

[3] In [1] or [2], the third side surface may include a first flat surface continuous with the bottom surface, and a first curved surface continuous with the first flat surface and the first main surface. The fourth side surface may include a second flat surface continuous with the bottom surface, and a second curved surface continuous with the second flat surface and the first main surface. In such a case, surfaces of the body region exposed at the third side surface and the fourth side surface can easily have characteristics similar to those of a crystal plane in which excellent channel characteristics can easily be obtained, and thus excellent channel characteristics can easily be obtained also on the third side surface and the fourth side surface.

[4] In [3], the body region may be exposed at the first flat surface and the second flat surface. In such a case, more favorable channel characteristics can easily be obtained.

[5] In [3] or [4], the radius of curvature at the third local minimum point between the first curved surface and the second curved surface may decrease as the cross section approaches the bottom surface. In such a case, surfaces of the body region exposed at the third side surface and the fourth side surface can easily have characteristics similar to those of a crystal plane in which excellent channel characteristics can easily be obtained. Thus, excellent channel characteristics can easily be obtained also on the third side surface and the fourth side surface.

[6] In any one of [3] to [5], the contour of the gate trench in the cross section parallel to the first main surface may include a first maximum point at which a radius of curvature is maximum on the first curved surface; and a second maximum point at which a radius of curvature is maximum on the second curved surface, and may include the radius of curvature at the first maximum point and the radius of curvature at the second maximum point may increase as the cross section approaches the bottom surface. In such a case, surfaces of the body region exposed at the third side surface and the fourth side surface can easily have characteristics similar to those of a crystal plane in which excellent channel characteristics can easily be obtained. Thus, excellent channel characteristics can easily be obtained also on the third side surface and the fourth side surface.

[7] In any one of [3] to [6], a thickness of the gate insulating film on the first flat surface, with respect to the first flat surface, may be smaller than a thickness of the gate insulating film on the first curved surface, with respect to the first curved surface, and a thickness of the gate insulating film on the second flat surface, with respect to the second flat surface, may be smaller than a thickness of the gate insulating film on the second curved surface, with respect to the second curved surface. In such a case, the control of the channels of both the body region exposed at the third side surface and the body region exposed at the fourth side surface can be easily facilitated.

[8] In any one of [1] to [7], the third side surface may have a first region having an inclination angle of greater than or equal to 25° and less than or equal to 45°, with respect to a normal direction of the first main surface, and the fourth side surface may have a second region having the inclination angle of greater than or equal to 25° and less than or equal to 45°, with respect to the normal direction of the first main surface. In such a case, a surface of the body region exposed at the third side surface and the surface of the body region exposed at the fourth side surface can easily have characteristics similar to those of a crystal plane in which excellent channel characteristics can easily be obtained. Thus, excellent channel characteristics can easily be obtained also on the third side surface and the fourth side surface.

[9] In [8], the body region may be exposed at the first region and the second region. In such a case, more favorable channel characteristics can easily be obtained.

Details of the Embodiments of the Present Disclosure

Figure 2:
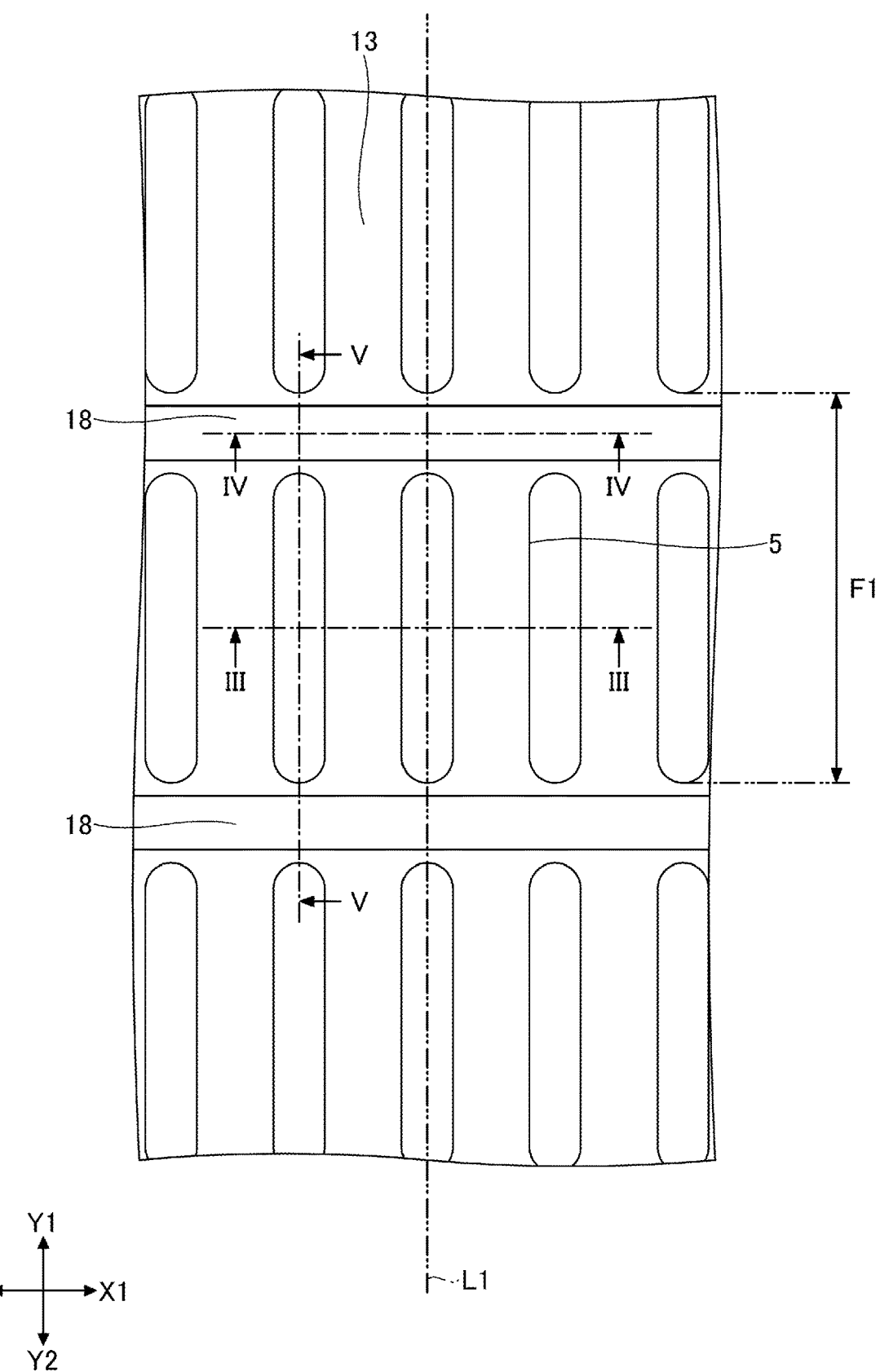
FIG. 2 is a diagram illustrating the configuration of the first main surface in the silicon carbide semiconductor device according to the embodiment.
Figure 3:
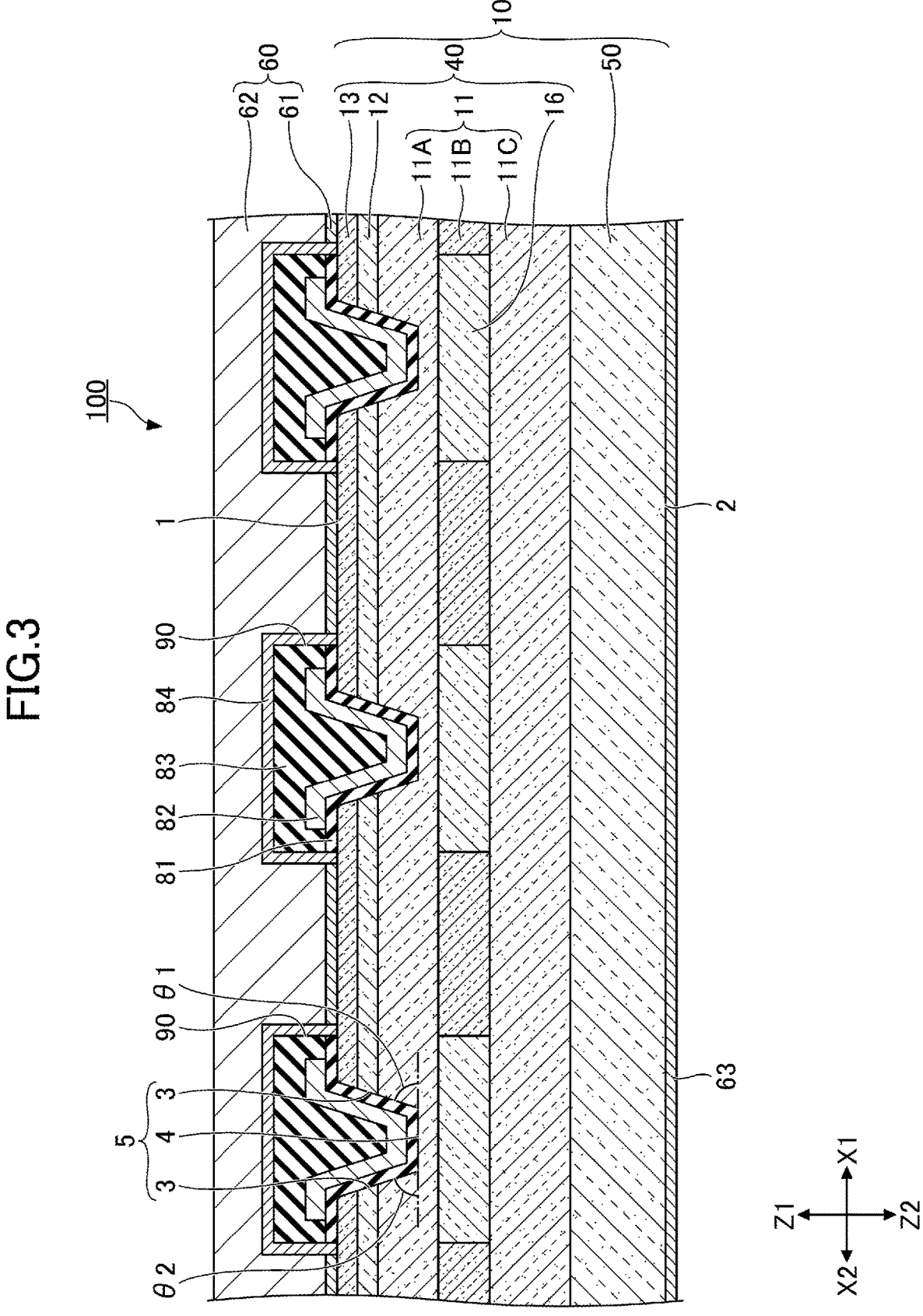
FIG. 3 is a cross-sectional view (first part) illustrating the configuration of the silicon carbide semiconductor device according to the embodiment.
Figure 4:
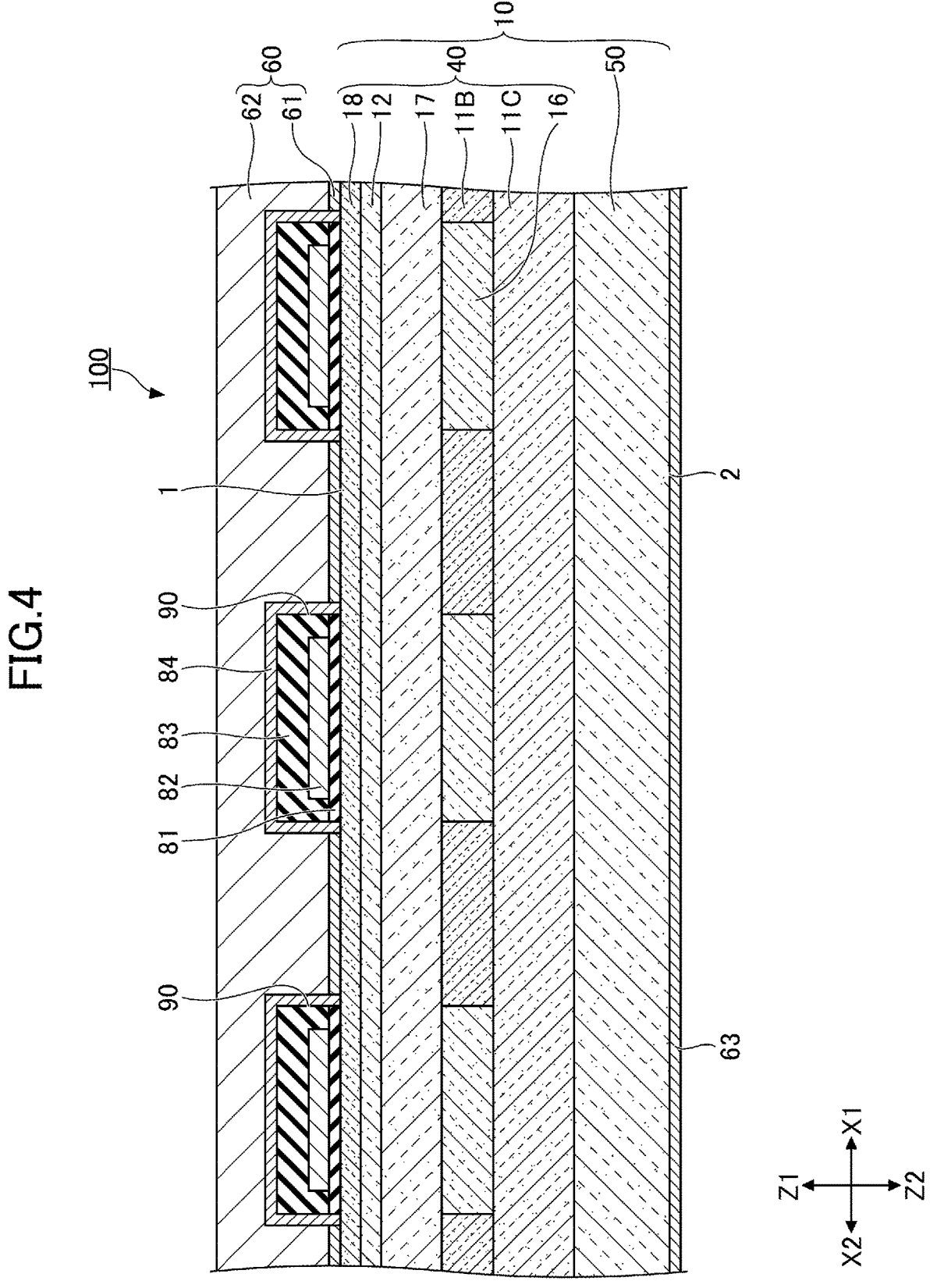
FIG. 4 is a cross-sectional view (second part) illustrating the configuration of the silicon carbide semiconductor device according to the embodiment.
Figure 5:
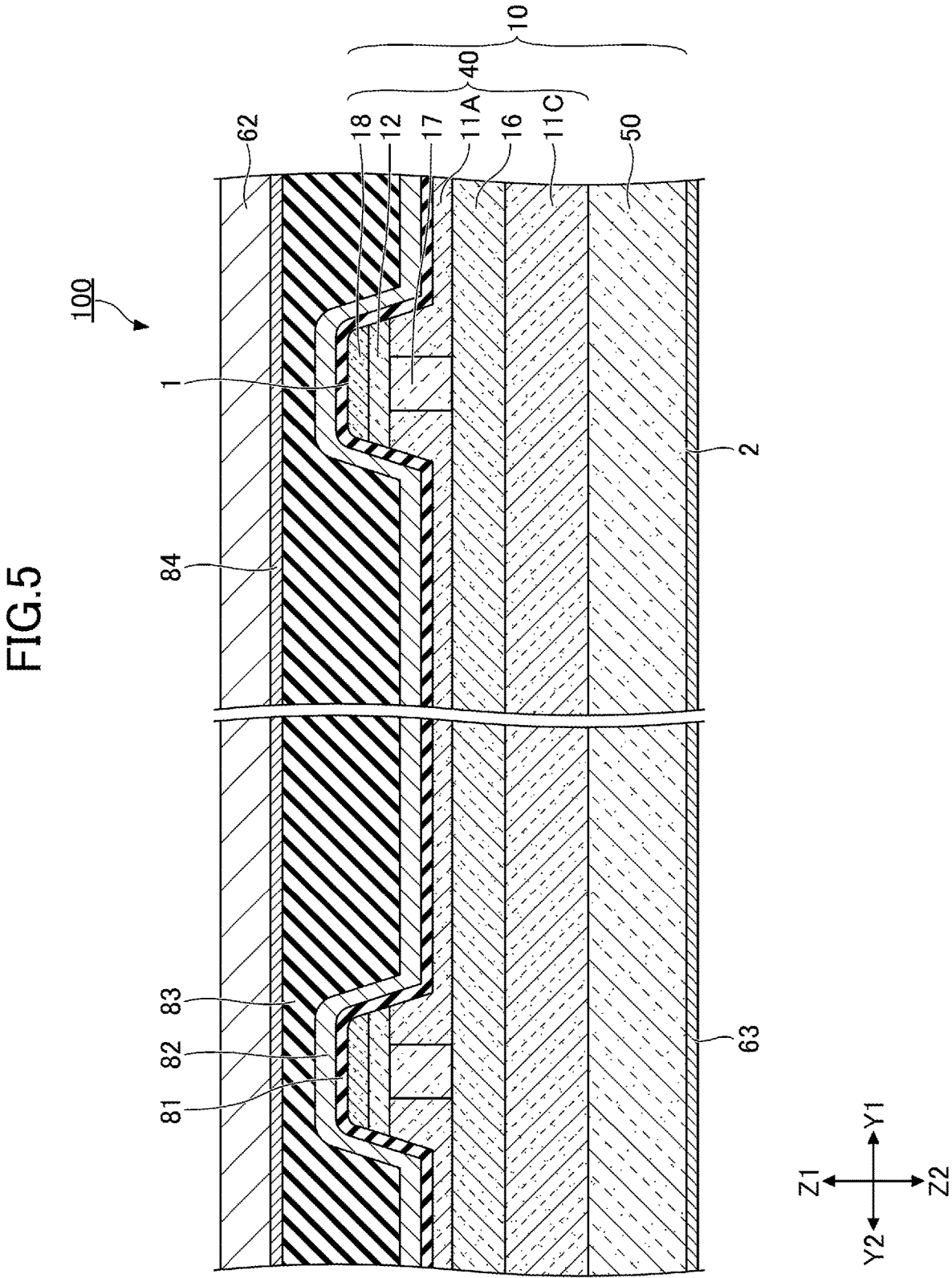
FIG. 5 is a cross-sectional view (third part) illustrating the configuration of the silicon carbide semiconductor device according to the embodiment.

The embodiments of the present disclosure relate to what is known as a vertical MOSFET (silicon carbide semiconductor device). FIG. 1 is a diagram illustrating the configuration of interlayer insulating films and a first main surface in the silicon carbide semiconductor device according to an embodiment. FIG. 2 is a diagram illustrating the configuration of the first main surface in the silicon carbide semiconductor device according to the embodiment. FIG. 3 to FIG. 5 are cross-sectional views illustrating configurations of the silicon carbide semiconductor device according to the embodiment. FIG. 3 corresponds to a cross-sectional view taken along a line III-III in FIG. 1 and FIG. 2. FIG. 4 corresponds to a cross-sectional view taken along a line IV-IV in FIG. 1 and FIG. 2. FIG. 5 corresponds to a cross-sectional view taken along a line V-V in FIG. 1 and FIG. 2.

As illustrated in FIG. 1 to FIG. 5, a MOSFET 100 according to the present embodiment mainly includes a silicon carbide substrate 10, a gate insulating film 81, a gate electrode 82, an interlayer insulating film 83, a source electrode 60, a drain electrode 63, and a barrier metal film 84. The silicon carbide substrate 10 includes a silicon carbide single-crystal substrate 50 and a silicon carbide epitaxial layer 40 that is disposed on the silicon carbide single-crystal substrate 50. The silicon carbide substrate 10 has a first main surface 1 and a second main surface 2 opposite to the first main surface 1. The silicon carbide epitaxial layer 40 constitutes the first main surface 1, and the silicon carbide single-crystal substrate 50 constitutes the second main surface 2. The silicon carbide single-crystal substrate 50 and the silicon carbide epitaxial layer 40 are made of, for example, hexagonal silicon carbide of a polytype 4H. The silicon carbide single-crystal substrate 50 includes an n type impurity such as nitrogen (N) and has an n type conductivity (first type conductivity).

The first main surface 1 is a {0001} plane or a plane inclined at an off angle of 8° or less in an off direction relative to the {0001} plane. The first main surface 1 is preferably a (000-1) plane or a plane inclined at the off angle of 8° or less in the off direction relative to the (000-1) plane. The off direction may be, for example, a <11-20> direction or a <1-100> direction. The off angle may be, for example, equal to or greater than 1°, or equal to or greater than 2°. The off angle may be less than or equal to 6°, or less than or equal to 4°.

The silicon carbide epitaxial layer 40 mainly includes a drift region 11, a body region 12, a source region 13, a field relief region 16, a connection region 17, and a contact region 18.

The drift region 11 is provided on the silicon carbide single-crystal substrate 50. The drift region 11 is located closer to the first main surface 1 than the silicon carbide single-crystal substrate 50 is. The drift region 11 may be continuous with the silicon carbide single-crystal substrate 50. The drift region 11 includes an n type impurity such as nitrogen or phosphorus (P), and has n type conductivity. The drift region 11 mainly includes, for example, a first region 11A, a second region 11B, and a third region 11C.

The body region 12 is provided on the drift region 11. The body region 12 includes a p type impurity such as aluminum (Al), and has a p type conductivity (second type conductivity). The body region 12 is located closer to the first main surface 1 (the Z1 side) than the drift region 11 is. The drift region 11 is located closer to the second main surface 2 (the Z2 side) than the body region 12 is. The body region 12 is in contact with the drift region 11.

The source region 13 is provided on the body region 12. The source region 13 is separated from the drift region 11 by the body region 12. The source region 13 includes an n type impurity such as nitrogen or phosphorus, and has an n type conductivity. The source region 13 is located closer to the first main surface 1 than the body region 12 is. The body region 12 is located closer to the second main surface 2 than the source region 13 is. The source region 13 is in contact with the body region 12. The source region 13 constitutes the first main surface 1. The source region 13 is covered with the gate insulating film 81. The source region 13 is in direct contact with the gate insulating film 81.

The contact region 18 includes a p type impurity such as aluminum, and has a p type conductivity. The effective concentration of the p type impurity in the contact region 18 is higher than, for example, the effective concentration of the p type impurity in the body region 12. The contact region 18 penetrates the source region 13 to be in contact with the body region 12. The contact region 18 constitutes the first main surface 1.

A gate trench 5 defined by side surfaces 3 and a bottom surface 4 is provided in the first main surface 1. The side surfaces 3 penetrate the source region 13, the body region 12, and the drift region 11 to reach the drift region 11. The bottom surface 4 is continuous with the side surfaces 3. The source region 13, the body region 12, and the drift region 11 are in contact with the side surfaces 3. The bottom surface 4 is located in the drift region 11. The bottom surface 4 is, for example, a plane parallel to the second main surface 2. The gate trench 5 will be described in detail below.

As illustrated in FIG. 1 and FIG. 2 in particular, in a plan view, that is, in a plan view in a direction perpendicular to the first main surface 1, the gate trench 5 overlaps with an imaginary straight line L1 extending in the Y1-Y2 direction (first direction) that is parallel to the first main surface 1. The gate trench 5 is located on the imaginary straight line L1 in a plan view. The gate trenches 5 are provided at regular intervals on the imaginary straight line L1. For example, the gate trenches 5 are provided to overlap the imaginary straight line L1 at first periods F1. Furthermore, in a plan view, the gate trenches 5 are provided at regular intervals in the X1-X2 direction (second direction) that is perpendicular to the Y1-Y2 direction. The gate trenches 5 may be provided in an array form, for example.

The field relief region 16 includes a p type impurity such as aluminum, and has a p type conductivity. The field relief region 16 is provided between the bottom surface 4 of the gate trench 5 and the second main surface 2. That is, the field relief region 16 is separated from the bottom surface 4 of the gate trench 5. The field relief region 16 overlaps the imaginary straight line L1 in a plan view, similarly to the gate trench 5. The field relief region 16 is located on the imaginary straight line L1 in a plan view. On the imaginary straight line L1, a single field relief region 16 may be provided for multiple gate trenches 5. In a plan view, the field relief regions 16 are provided at regular intervals in the X1-X2 direction. The field relief regions 16 may be provided in a stripe form.

The third region 11C of the drift region 11 is located closer to the second main surface 2 than the field relief region 16 is. The third region 11C is in contact with the field relief region 16. Third region 11C is located closer to the first main surface 1 than the silicon carbide single-crystal substrate 50 is. Third region 11C may be interposed between the field relief region 16 and the silicon carbide single-crystal substrate 50. The third region 11C may be continuous with the silicon carbide single-crystal substrate 50. A buffer layer including an n type impurity, such as nitride, and having the n type conductivity may be provided between the silicon carbide single-crystal substrate 50 and the third region 11C.

The second region 11B is located closer to the first main surface 1 than the third region 11C is. The second region 11B is continuous with the third region 11C. The second region 11B is in contact with the field relief region 16 in the X1-X2 direction. The second region 11B and the field relief region 16 may be located in the same plane that is parallel to the second main surface 2.

The first region 11A is located closer to the second main surface 2 than the body region 12 is, and is located closer to the first main surface 1 than the field relief region 16 and the second region 11B are. The first region 11A is continuous with the second region 11B. The first region 11A is interposed between the body region 12 and a set of the field relief region 16 and the second region 11B. The first region 11A is in contact with each of the body region 12, the field relief region 16, and the second region 11B. The first region 11A may include a current diffusion region. The upper end surface of the first region 11A includes, for example, the bottom surface 4 of the gate trench 5.

The gate insulating film 81 is, for example, an oxide film. The gate insulating film 81 is made of, for example, a material containing silicon dioxide. The gate insulating film 81 is in contact with the side surfaces 3 and the bottom surface 4. The gate insulating film 81 is in contact with the drift region 11 at the bottom surface 4.

The gate insulating film 81 is in contact with each of the source region 13, the body region 12, and the drift region 11, at the side surfaces 3. The gate insulating film 81 may be in contact with the source region 13 and the contact region 18, at first main surface 1.

The gate electrode 82 is provided on the gate insulating film 81. The gate electrode 82 is made of, for example, polysilicon (poly-Si) including a conductive impurity. The gate electrode 82 is disposed inside the gate trench 5. The interlayer insulating film 83 is provided in contact with the gate electrode 82 and the gate insulating film 81. The interlayer insulating film 83 is, for example, an oxide film. The interlayer insulating film 83 is made of, for example, a material containing silicon dioxide. The interlayer insulating film 83 electrically insulates the gate electrode 82 and the source electrode 60 from each other. A portion of the interlayer insulating film 83 may be provided inside the gate trench 5.

In a plan view, the interlayer insulating film 83 overlaps the imaginary straight line L1, similarly to the gate trench 5 and the field relief region 16. On the imaginary straight line L1, a single interlayer insulating film 83 may be provided for multiple gate trenches 5. In a plan view, contact holes 90 are formed in the interlayer insulating film 83 and the gate insulating film 81 at regular intervals in the X1-X2 direction. The contact holes 90 are provided such that the gate trench 5 is located between adjacent contact holes 90 in the X1-X2 direction in a plan view. The contact hole 90 extends in the Y1-Y2 direction. The source region 13 and the contact region 18 are exposed from the interlayer insulating film 83 and the gate insulating film 81 through the contact hole 90.

As illustrated in FIG. 1 and FIG. 2 in particular, the contact region 18 extends in the X1-X2 direction through between adjacent gate trenches 5 in the Y1-Y2 direction, and intersects with the imaginary straight line L1. The interlayer insulating film 83 covers a portion of the contact region 18 between adjacent gate trenches 5 in the Y1-Y2 direction. The gate insulating film 81 and the gate electrode 82 are interposed between the contact region 18 and the interlayer insulating film 83 in the Z1-Z2 direction. Another portion of the contact region 18 is exposed from the interlayer insulating film 83 through the contact hole 90 between two adjacent imaginary straight lines L1 in the X1-X2 direction.

The connection region 17 includes a p type impurity such as aluminum and has a p type conductivity. The connection region 17 electrically connects the contact region 18 and the field relief region 16. The connection region 17 is in contact with the field relief region 16 on the imaginary straight line L1. The connection region 17 may extend in the X1-X2 direction, similarly to the contact region 18. In a plan view, the connection region 17 may be provided between adjacent gate trenches 5 in the Y1-Y2 direction. The connection region 17 is in contact with the contact region 18 or the body region 12. The connection region 17 may be in contact with each of the body region 12 and the contact region 18. The connection region 17 may be in direct contact with the contact region 18. The body region 12 may be in direct contact with the contact region 18, and the connection region 17 may be in direct contact with body region 12. The connection region 17 is located between the field relief region 16 and the contact region 18 in the Z1-Z2 direction. The connection region 17 is located closer to the second main surface 2 than the contact region 18 is.

The connection region 17 is located closer to the first main surface 1 than the field relief region 16 is. For example, the connection region 17 may be in contact with each of the contact region 18 and the field relief region 16. In a case where the connection region 17 is located between the field relief region 16 and the contact region 18 in the Z1-Z2 direction and is in contact with each of the contact region 18 and the field relief region 16, the series resistance between the contact region 18 and the field relief region 16 is reduced.

If the gate trenches 5 arranged in the Y1-Y2 direction is assumed to be one gate trench assembly, the gate trench assembly can be regarded as being divided into the gate trenches 5 by the contact region 18 and the connection region 17.

The barrier metal film 84 covers the upper surface and the side surfaces of the interlayer insulating film 83 and the side surfaces of the gate insulating film 81. The barrier metal film 84 is in contact with each of the interlayer insulating film 83 and the gate insulating film 81. The barrier metal film 84 is made of a material containing, for example, titanium nitride (TiN).

The source electrode 60 is in contact with the first main surface 1. The source electrode 60 includes a contact electrode 61 and a source wiring 62. The contact electrode 61 is in contact with the source region 13 and the contact region 18 at the first main surface 1. The contact electrode 61 is made of a material containing, for example, nickel silicide (NiSi). The contact electrode 61 may be made of a material containing titanium, aluminum, and silicon. The contact electrode 61 is in ohmic contact with the source region 13 and the contact region 18. The source wiring 62 covers the upper surface and the side surfaces of the barrier metal film 84 and the upper surface of the contact electrode 61. The source wiring 62 is in contact with each of the barrier metal film 84 and the contact electrode 61. The source wiring 62 is made of, for example, a material containing aluminum.

The drain electrode 63 is in contact with the second main surface 2. The drain electrode 63 is in contact with the silicon carbide single-crystal substrate 50 at the second main surface 2. The drain electrode 63 is electrically connected to the drift region 11. The drain electrode 63 is made of a material containing, for example, nickel silicide. The drain electrode 63 may be made of a material containing titanium, aluminum, and silicon. The drain electrode 63 is in ohmic contact with the silicon carbide single-crystal substrate 50.

Figure 6:
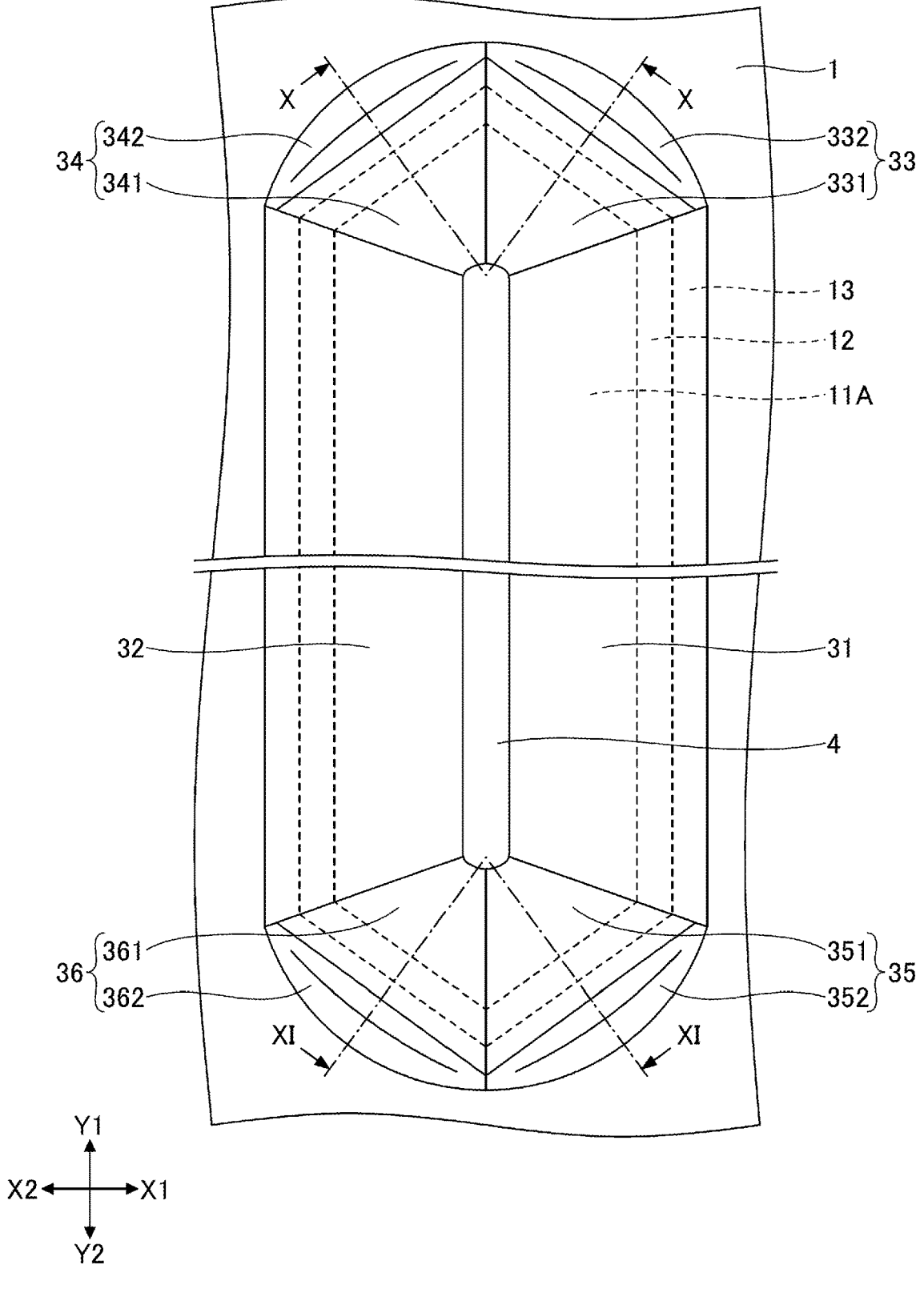
FIG. 6 is a top view illustrating a gate trench.
Figure 7:
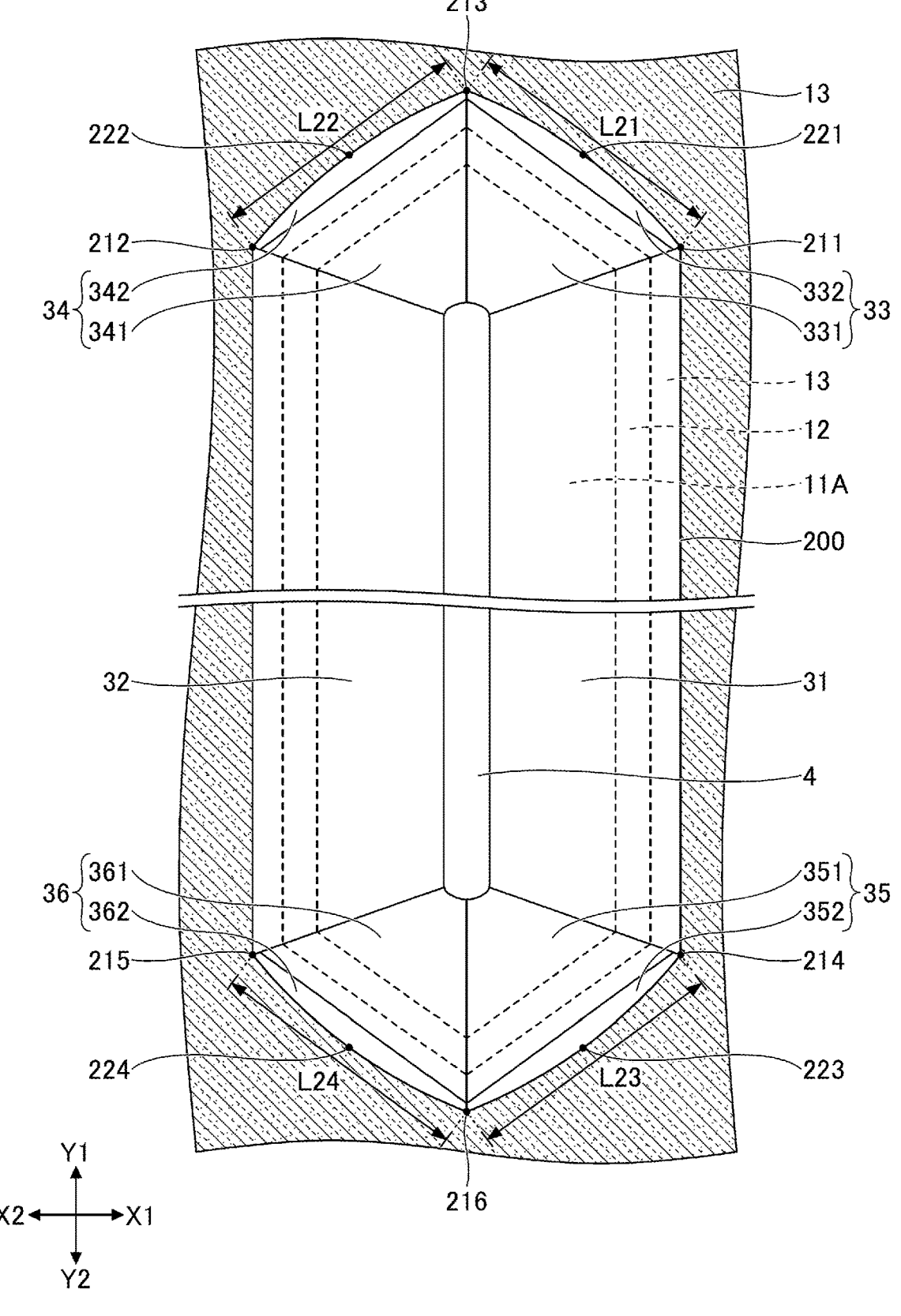
FIG. 7 is a cross-sectional view (first part) illustrating the gate trench.
Figure 8:
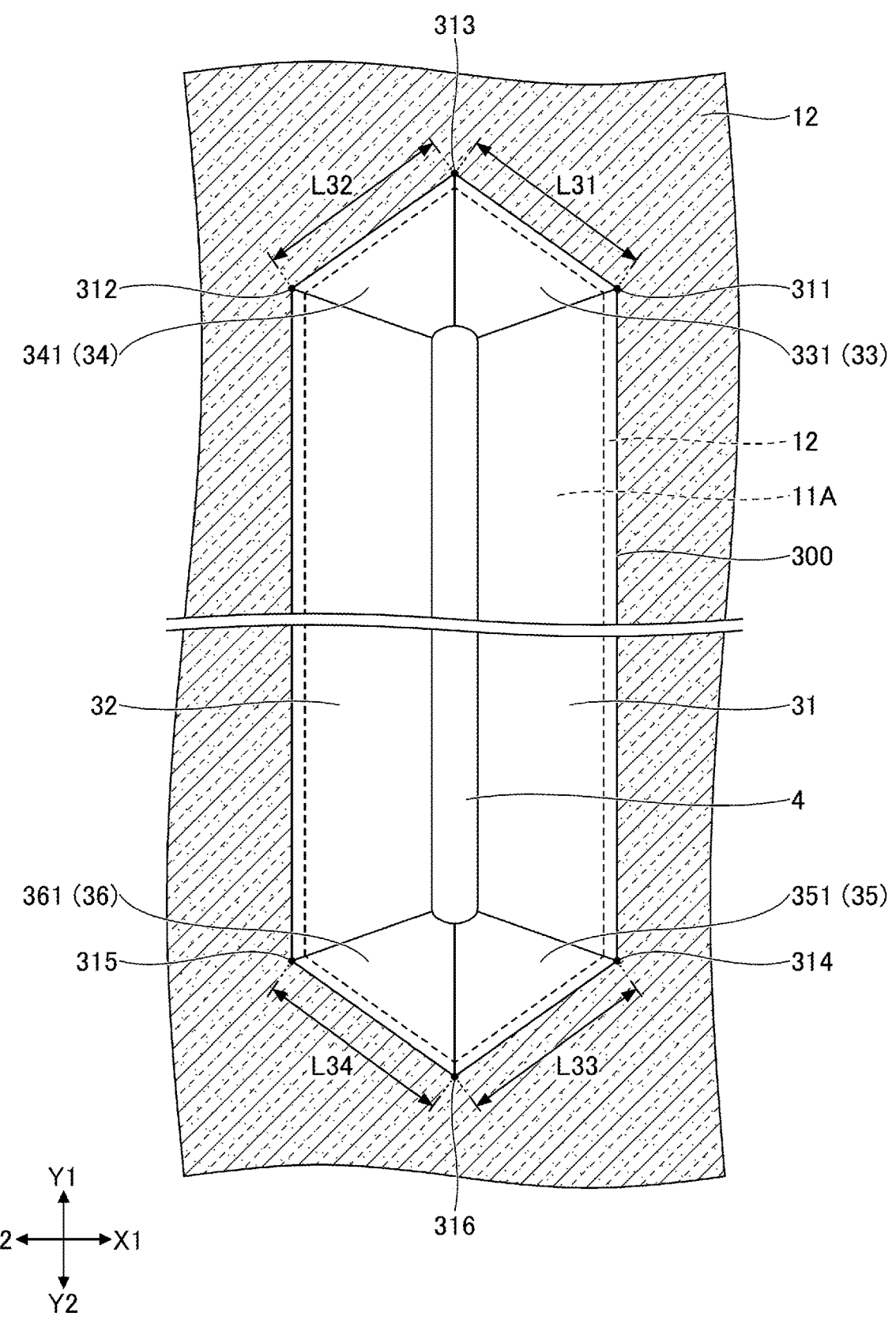
FIG. 8 is a cross-sectional view (second part) illustrating the gate trench.
Figure 9:
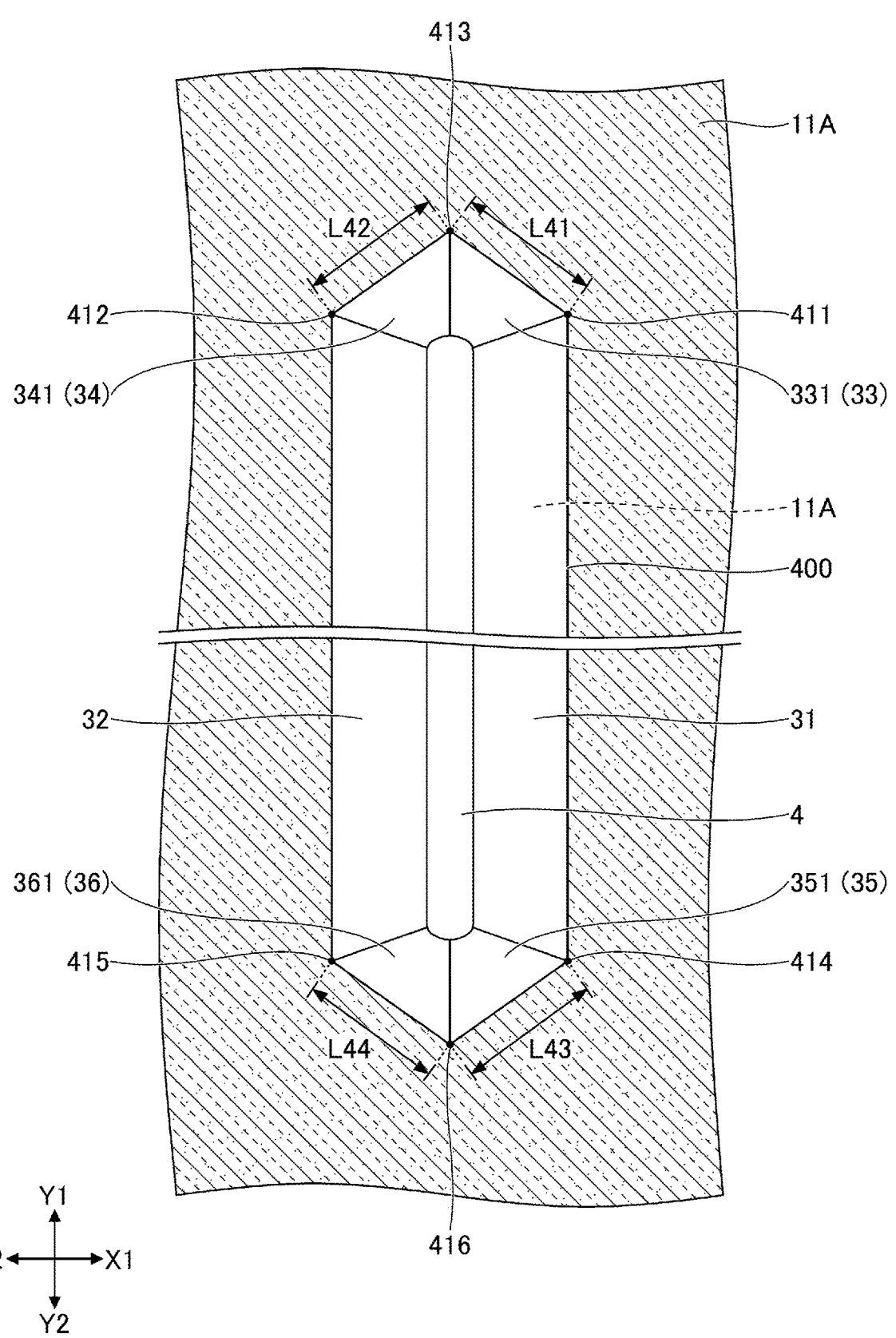
FIG. 9 is a cross-sectional view (third part) illustrating the gate trench.
Figure 10:
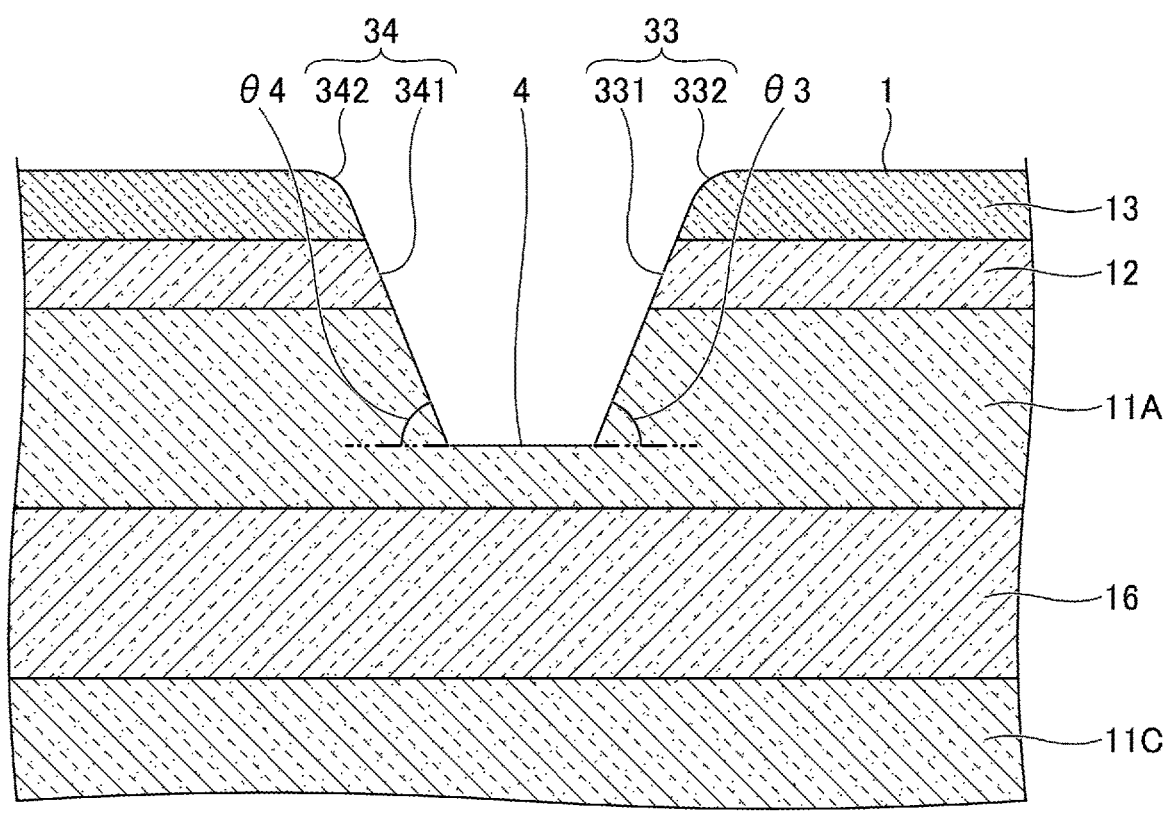
FIG. 10 is a cross-sectional view (fourth part) illustrating the gate trench.
Figure 10:
Figure 11:
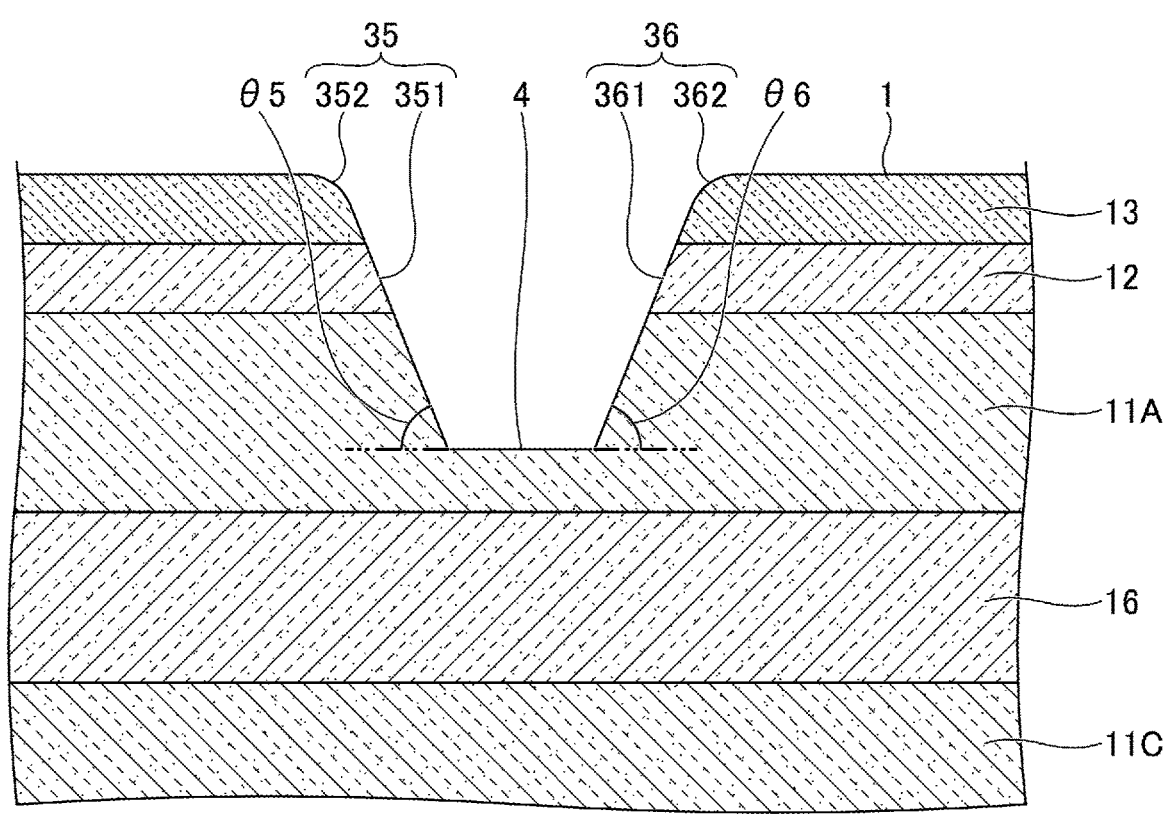
FIG. 11 is a cross-sectional view (fifth part) illustrating the gate trench.
Figure 11:

Hereinafter, the gate trench 5 will be described in detail. FIG. 6 is a top view illustrating the gate trench. FIG. 7 to FIG. 11 are cross-sectional views illustrating the gate trench. FIG. 7 to FIG. 9 each illustrate a contour of the gate trench in a cross section that is parallel to the first main surface 1. FIG. 7 illustrates the contour of the gate trench in a cross section in the source region 13. FIG. 8 illustrates the contour of the gate trench in a cross section in the body region 12. FIG. 9 illustrates the contour of the gate trench in a cross section in the drift region 11. FIG. 10 corresponds to the cross-sectional view taken along the line X-X in FIG. 6. FIG. 11 corresponds to the cross-sectional view taken along the line XI-XI in FIG. 6.

The bottom surface 4 is a surface that is substantially parallel to the first main surface 1 of the silicon carbide substrate 10. The side surfaces 3 of the gate trench 5 include a first side surface 31, a second side surface 32, a third side surface 33, a fourth side surface 34, a fifth side surface 35, and a sixth side surface 36. The first side surface 31 is located on an X1 side of the bottom surface 4 and extends in the Y1-Y2 direction along the imaginary straight line L1.

The second side surface 32 is located on an X2 side of the bottom surface 4 and extends in the Y1-Y2 direction along the imaginary straight line L1. The first side surface 31 and the second side surface 32 are separated from each other in the X1-X2 direction. The third side surface 33 is located on a Y1 side of the bottom surface 4 and is continuous with the first side surface 31. The fourth side surface 34 is located on the Y1 side of the bottom surface 4 and is continuous with the second side surface 32 and the third side surface 33. The third side surface 33 is located on the X1 side of the fourth side surface 34, and the fourth side surface 34 is located on the X2 side of the third side surface 33. The fifth side surface 35 is located on a Y2 side of the bottom surface 4 and is continuous with the first side surface 31. The sixth side surface 36 is located on the Y2 side of the bottom surface 4 and is continuous with the second side surface 32 and the fifth side surface 35. The fifth side surface 35 is located on the X1 side of the sixth side surface 36, and the sixth side surface 36 is located on the X2 side of the fifth side surface 35. A set of the third side surface 33 and the fourth side surface 34 and a set of the fifth side surface 35 and the sixth side surface 36 are separated from each other in the Y1-Y2 direction.

The contour of the gate trench 5 is linear on the first side surface 31 and the second side surface 32 in the first main surface 1. The contour of the gate trench 5 is curved along the third side surface 33 and the fourth side surface 34 in the first main surface 1. For example, in a plan view, the contour on the third side surface 33 and the fourth side surface 34 in the first main surface 1 is curved so as to be convex toward the side (Y1 side) away from the bottom surface 4. The contour of the gate trench 5 is curved along the fifth side surface 35 and the sixth side surface 36 in the first main surface 1. For example, in a plan view, the contour on the fifth side surface 35 and the sixth side surface 36 in the first main surface 1 is curved so as to be convex toward the side (Y2 side) away from the bottom surface 4.

As illustrated in FIG. 3, the first side surface 31 is continuous with the bottom surface 4 and is inclined at an angle θ1 with respect to a plane parallel to the first main surface 1. The angle θ1 of the first side surface 31 with respect to a plane including the bottom surface 4 is, for example, greater than or equal to 45° and less than or equal to 65°. The angle θ1 may be, for example, greater than or equal to 50° and less than or equal to 60°. The first side surface 31 preferably has a {0-33-8} plane. The {0-33-8} plane is a crystal plane that provides excellent mobility.

As illustrated in FIG. 3, the second side surface 32 is continuous with the bottom surface 4 and is inclined at an angle θ2 with respect to a plane parallel to the first main surface 1. The angle θ2 of the second side surface 32 with respect to the plane including the bottom surface 4 is, for example, greater than or equal to 45° and less than or equal to 65°. The angle θ2 may be, for example, greater than or equal to 50° and less than or equal to 60°. The second side surface 32 preferably has the {0-33-8} plane.

As illustrated in FIG. 6 to FIG. 10, the third side surface 33 has a first flat surface 331 and a first curved surface 332. The first flat surface 331 is located on the Z2 side of the first curved surface 332, and the first curved surface 332 is located on the Z1 side of the first flat surface 331. The first flat surface 331 and the first curved surface 332 are continuous with each other. The first flat surface 331 is continuous with the bottom surface 4. The first curved surface 332 is continuous with the first main surface 1.

An angle θ3 of the first flat surface 331 with respect to the plane including the bottom surface 4 is, for example, greater than or equal to 45° and less than or equal to 65°. The angle θ3 may be, for example, greater than or equal to 50° and less than or equal to 60°. The first flat surface 331 preferably has the {0-33-8} plane. The first flat surface 331 is an example of a first region having an inclination angle of greater than or equal to 25° and less than or equal to 45°, with respect to the normal direction of the first main surface 1.

A first boundary between the first flat surface 331 and the first curved surface 332 is located in, for example, the source region 13. In other words, the first boundary is located between the body region 12 and the first main surface 1. The first flat surface 331 is formed by a portion of the source region 13, the body region 12, and the drift region 11. The body region 12 is exposed at the first flat surface 331. The first curved surface 332 is formed by another portion of the source region 13. The first curved surface 332 is three dimensionally curved so as to be convex toward the inside of the gate trench 5.

As illustrated in FIG. 6 to FIG. 10, the fourth side surface 34 has a second flat surface 341 and a second curved surface 342. The second flat surface 341 is located on the Z2 side of the second curved surface 342, and the second curved surface 342 is located on the Z1 side of the second flat surface 341. The second flat surface 341 and the second curved surface 342 are continuous with each other. The second flat surface 341 is continuous with the bottom surface 4. The second curved surface 342 is continuous with the first main surface 1.

An angle θ4 of the second flat surface 341 with respect to the plane including the bottom surface 4 is, for example, greater than or equal to 45° and less than or equal to 65°. The angle θ4 may be, for example, greater than or equal to 50° and less than or equal to 60°. The second flat surface 341 preferably has the {0-33-8} plane. The second flat surface 341 is an example of a second region having an inclination angle of greater than or equal to 25° and less than or equal to 45°, with respect to the normal direction of the first main surface 1.

A second boundary between the second flat surface 341 and the second curved surface 342 is located in, for example, the source region 13. In other words, the second boundary is located between the body region 12 and the first main surface 1. The second flat surface 341 is formed by a portion of the source region 13, the body region 12, and the drift region 11. The body region 12 is exposed at the second flat surface 341. The second curved surface 342 is formed by another portion of the source region 13. The second curved surface 342 is three dimensionally curved so as to be convex toward the inside of the gate trench 5.

As illustrated in FIG. 6 to FIG. 9 and FIG. 11, the fifth side surface 35 has a third flat surface 351 and a third curved surface 352. The third flat surface 351 is located on the Z2 side of the third curved surface 352, and the third curved surface 352 is located on the Z1 side of the third flat surface 351. The third flat surface 351 and the third curved surface 352 are continuous with each other. The third flat surface 351 is continuous with the bottom surface 4. The third curved surface 352 is continuous with first main surface 1.

An angle θ5 of the third flat surface 351 with respect to the plane including the bottom surface 4 is, for example, greater than or equal to 45° and less than or equal to 65°. The angle θ5 may be, for example, greater than or equal to 50° and less than or equal to 60°. The third flat surface 351 preferably has the {0-33-8} plane. The third flat surface 351 is an example of the first region having an inclination angle of greater than or equal to 25° and less than or equal to 45°, with respect to the normal direction of the first main surface 1.

A third boundary between the third flat surface 351 and the third curved surface 352 is located in, for example, the source region 13. In other words, the third boundary is located between the body region 12 and the first main surface 1. The third flat surface 351 is formed by a portion of the source region 13, the body region 12, and the drift region 11. The body region 12 is exposed at the third flat surface 351. The third curved surface 352 is formed by another portion of the source region 13. The third curved surface 352 is curved three dimensionally so as to be convex toward the inside of the gate trench 5.

As illustrated in FIG. 6 to FIG. 9 and FIG. 11, the sixth side surface 36 has a fourth flat surface 361 and a fourth curved surface 362. The fourth flat surface 361 is located on the Z2 side of the fourth curved surface 362, and the fourth curved surface 362 is located on the Z1 side of the fourth flat surface 361. The fourth flat surface 361 and the fourth curved surface 362 are continuous with each other. The fourth flat surface 361 is continuous with the bottom surface 4. The fourth curved surface 362 is continuous with first main surface 1.

An angle θ6 of the fourth flat surface 361 with respect to the plane including the bottom surface 4 is, for example, greater than or equal to 45° and less than or equal to 65°. The angle θ6 may be, for example, greater than or equal to 50° and less than or equal to 60°. The fourth flat surface 361 preferably has the {0-33-8} plane. The fourth flat surface 361 is an example of the second region having an inclination angle of greater than or equal to 25° and less than or equal to 45°, with respect to the normal direction of the first main surface 1.

A fourth boundary between the fourth flat surface 361 and the fourth curved surface 362 is located in, for example, the source region 13. In other words, the fourth boundary is located between the body region 12 and the first main surface 1. The fourth flat surface 361 is formed by a portion of the source region 13, the body region 12, and the drift region 11. The body region 12 is exposed at the fourth flat surface 361. The fourth curved surface 362 is formed by another portion of the source region 13. The fourth curved surface 362 is curved three dimensionally so as to be convex toward the inside of the gate trench 5.

As illustrated in FIG. 7, a gate trench contour 200 in the cross section, which is parallel to the first main surface 1, in the source region 13 has a first local minimum point 211, a second local minimum point 212, a third local minimum point 213, a fourth local minimum point 214, a fifth local minimum point 215, and a sixth local minimum point 216, with respect to the radius of curvature. The first local minimum point 211 is a local minimum point at which the radius of curvature is a local minimum at the boundary between the first side surface 31 and the third side surface 33. The second local minimum point 212 is a local minimum point at which the radius of curvature is a local minimum at the boundary between the second side surface 32 and the fourth side surface 34. The third local minimum point 213 is a local minimum point at which the radius of curvature is a local minimum at the boundary between the third side surface 33 and the fourth side surface 34. The fourth local minimum point 214 is a local minimum point at which the radius of curvature is a local minimum at the boundary between the first side surface 31 and the fifth side surface 35. The fifth local minimum point 215 is a local minimum point at which the radius of curvature is a local minimum at the boundary between the second side surface 32 and the sixth side surface 36. The sixth local minimum point 216 is a local minimum point at which the radius of curvature is a local minimum at the boundary between the fifth side surface 35 and the sixth side surface 36.

The contour 200 of the gate trench has a first maximum point 221, a second maximum point 222, a third maximum point 223, and a fourth maximum point 224 with respect to the radius of curvature. The first maximum point 221 is a maximum point at which the radius of curvature is maximum on the first curved surface 332. The second maximum point 222 is a maximum point at which the radius of curvature is maximum on the second curved surface 342. The third maximum point 223 is a maximum point at which the radius of curvature is maximum on the third curved surface 352. The fourth maximum point 224 is a maximum point at which the radius of curvature is maximum on the fourth curved surface 362.

The radius of curvature at the first maximum point 221, the radius of curvature at the second maximum point 222, the radius of curvature at the third maximum point 223, and the radius of curvature at the fourth maximum point 224 may increase as the cross section parallel to the first main surface 1 approaches the bottom surface 4.

As illustrated in FIG. 8, a gate trench contour 300 in the cross section, which is parallel to the first main surface 1, in the body region 12 has a first local minimum point 311, a second local minimum point 312, a third local minimum point 313, a fourth local minimum point 314, a fifth local minimum point 315, and a sixth local minimum point 316, with respect to the radius of curvature. The first local minimum point 311 is a local minimum point at which the radius of curvature is a local minimum at the boundary between the first side surface 31 and the third side surface 33. The second local minimum point 312 is a local minimum point at which the radius of curvature is a local minimum at the boundary between the second side surface 32 and the fourth side surface 34. The third local minimum point 313 is a local minimum point at which the radius of curvature is a local minimum at the boundary between the third side surface 33 and the fourth side surface 34. The fourth local minimum point 314 is a local minimum point at which the radius of curvature is a local minimum at the boundary between the first side surface 31 and the fifth side surface 35. The fifth local minimum point 315 is a local minimum point at which the radius of curvature is a local minimum at the boundary between the second side surface 32 and the sixth side surface 36. The sixth local minimum point 316 is a local minimum point at which the radius of curvature is a local minimum at the boundary between the fifth side surface 35 and the sixth side surface 36.

As illustrated in FIG. 9, a gate trench contour 400 in the cross section, which is parallel to the first main surface 1, in the first region 11A of the drift region 11 has a first local minimum point 411, a second local minimum point 412, a third local minimum point 413, a fourth local minimum point 414, a fifth local minimum point 415, and a sixth local minimum point 416, with respect to the radius of curvature. The first local minimum point 411 is a local minimum point at which the radius of curvature is a local minimum at the boundary between the first side surface 31 and the third side surface 33. The second local minimum point 412 is a local minimum point at which the radius of curvature is a local minimum at the boundary between the second side surface 32 and the fourth side surface 34. The third local minimum point 413 is a local minimum point at which the radius of curvature is a local minimum at the boundary between the third side surface 33 and the fourth side surface 34. The fourth local minimum point 414 is a local minimum point at which the radius of curvature is a local minimum at the boundary between the first side surface 31 and the fifth side surface 35. The fifth local minimum point 415 is a local minimum point at which the radius of curvature is a local minimum at the boundary between the second side surface 32 and the sixth side surface 36. The sixth local minimum point 416 is a local minimum point at which the radius of curvature is a local minimum at the boundary between the fifth side surface 35 and the sixth side surface 36.

As illustrated in FIG. 7 to FIG. 9, the distance between the first local minimum point and the third local minimum point may decrease as the cross section parallel to the first main surface 1 approaches the bottom surface 4. For example, a length L31 (see FIG. 8) between the first local minimum point 311 and the third local minimum point 313 on the contour 300 is shorter than a length L21 (see FIG. 7) between the first local minimum point 211 and the third local minimum point 213 on the contour 200, and a length L41 (see FIG. 9) between the first local minimum point 411 and the third local minimum point 413 on the contour 400 is shorter than the length L31 (see FIG. 8).

The distance between the second local minimum point and the third local minimum point may decrease as the cross section parallel to the first main surface 1 approaches the bottom surface 4. For example, a length L32 (see FIG. 8) between the second local minimum point 312 and the third local minimum point 313 on the contour 300 is shorter than a length L22 (see FIG. 7) between the second local minimum point 212 and the third local minimum point 213 on the contour 200, and a length L42 (see FIG. 9) between the second local minimum point 412 and the third local minimum point 413 on the contour 400 is shorter than the length L32 (see FIG. 8).

The distance between the fourth local minimum point and the sixth local minimum point may decrease as the cross section parallel to the first main surface 1 approaches the bottom surface 4. For example, a length L33 (see FIG. 8) between the fourth local minimum point 314 and the sixth local minimum point 316 on the contour 300 is shorter than a length L23 (see FIG. 7) between the fourth local minimum point 214 and the sixth local minimum point 216 on the contour 200, and a length L43 (see FIG. 9) between the fourth local minimum point 414 and the sixth local minimum point 416 on the contour 400 is shorter than the length L33 (see FIG. 8).

The distance between the fifth local minimum point and the sixth local minimum point may decrease as the cross section parallel to the first main surface 1 approaches the bottom surface 4. For example, a length L34 (see FIG. 8) between the fifth local minimum point 315 and the sixth local minimum point 316 on the contour 300 is shorter than a length L24 (see FIG. 7) between the fifth local minimum point 215 and the sixth local minimum point 216 on the contour 200, and a length L44 (see FIG. 9) between the fifth local minimum point 415 and the sixth local minimum point 416 on the contour 400 is shorter than the length L34 (see FIG. 8).

The radius of curvature at the third local minimum point between the first curved surface 332 and the second curved surface 342 may decrease as the cross section parallel to the first main surface 1 approaches the bottom surface 4. Similarly, the radius of curvature at the sixth local minimum point between the third curved surface 352 and the fourth curved surface 362 may decrease as the cross section parallel to the first main surface 1 approaches the bottom surface 4.

Hereinafter, a method of manufacturing the MOSFET 100 according to the embodiment will be described. FIG. 12 to FIG. 22 are cross-sectional views illustrating the method of manufacturing the MOSFET 100 according to the embodiment. FIG. 12 to FIG. 14, FIG. 16 and FIG. 18 to FIG. 22 illustrate changes in the cross-section illustrated in FIG. 3. FIG. 15 and FIG. 17 illustrate changes in the cross-section illustrated in FIG. 4.

Figure 12:
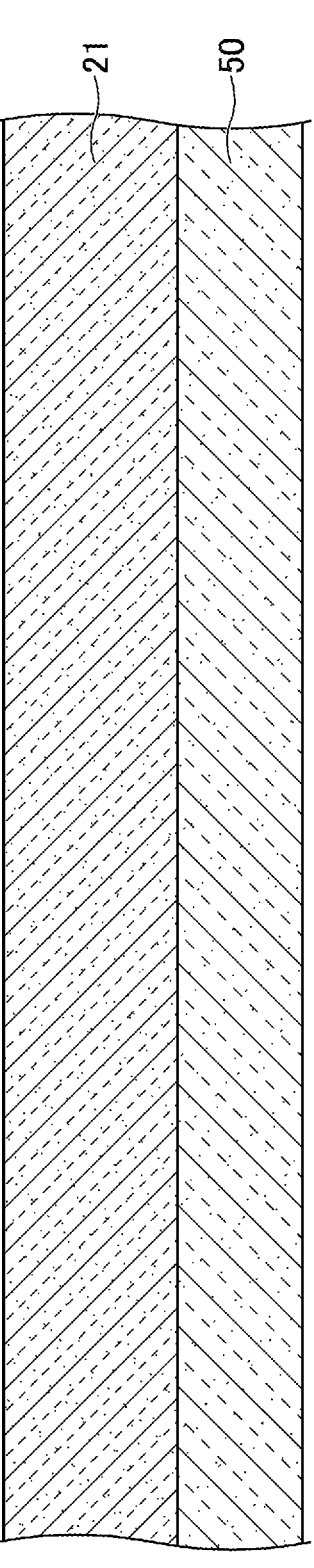
FIG. 12 is a cross-sectional view (first part) illustrating a method of manufacturing the silicon carbide semiconductor device according to the embodiment.
Figure 12:
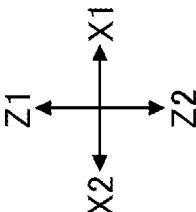

First, as illustrated in FIG. 12, the silicon carbide single-crystal substrate 50 is prepared. For example, the silicon carbide single-crystal substrate 50 is prepared by slicing a silicon carbide ingot (not illustrated) being manufactured by sublimation. A buffer layer (not illustrated) may be formed on the silicon carbide single-crystal substrate 50. The buffer layer can be formed by a chemical vapor deposition (CVD) method using a mixed gas of silane ($SiH_4$) and propane ($C_3H_8$) as a source gas and using, for example, nitrogen ($H_2$) as a carrier gas. During the epitaxial growth of the buffer layer, an n type impurity such as nitrogen may be implanted into the buffer layer.

Next, as also illustrated in FIG. 12, a first epitaxial layer 21 is formed. The first epitaxial layer 21 is formed on the silicon carbide single-crystal substrate 50 by the CVD method using, for example, the mixed gas of silane and propane as the source gas and using, for example, hydrogen as the carrier gas. During the epitaxial growth, an n type impurity such as nitrogen is implanted into the first epitaxial layer 21. The first epitaxial layer 21 has n type conductivity. The effective concentration of the n type impurity in the first epitaxial layer 21 may be lower than the effective concentration of the n type impurity in the buffer layer.

Figure 13:
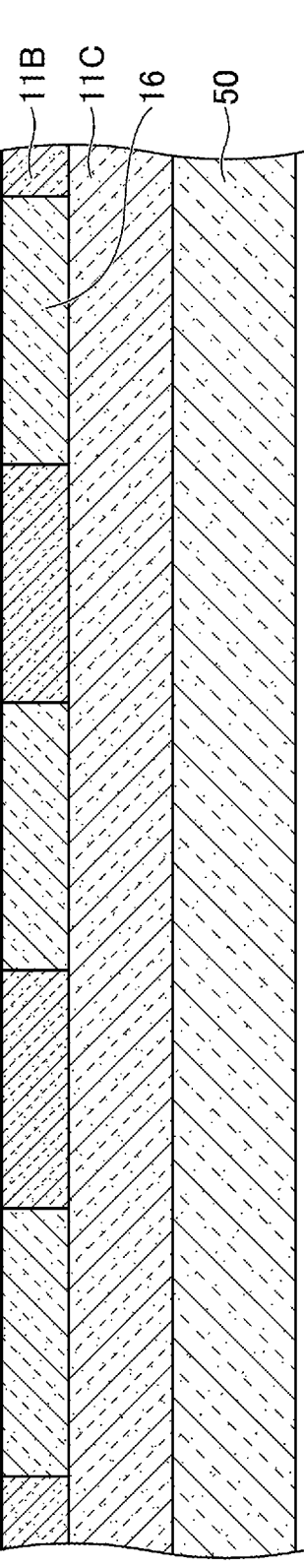
FIG. 13 is a cross-sectional view (second part) illustrating the method of manufacturing the silicon carbide semiconductor device according to the embodiment.
Figure 13:
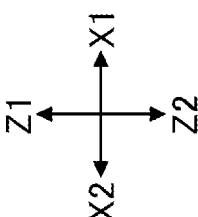

Next, as illustrated in FIG. 13, the field relief region 16 is formed. For example, a mask layer (not illustrated) having an opening is formed on a region where the field relief region 16 is formed. P type impurity ions capable of imparting p type conductivity, such as aluminum ions, are then implanted into the first epitaxial layer 21. Thus, the field relief region 16 is formed.

Next, as also illustrated in FIG. 13, the second region 11B is formed. For example, a mask layer (not illustrated) having an opening is formed on a region where the second region 11B is formed, that is, a region on a side of the field relief region 16 in a direction parallel to the second main surface 2. N type impurity ions capable of imparting the n type conductivity, such as nitrogen, are then implanted into the first epitaxial layer 21. With this approach, the second region 11B is formed. In the first epitaxial layer 21, a portion (on the Z2 side) located closer to the silicon carbide single-crystal substrate 50 than the field relief region 16 is, and a portion (on the Z2 side) located closer to the silicon carbide single-crystal substrate 50 than the second region 11B is, form the third region 11C.

Figure 14:
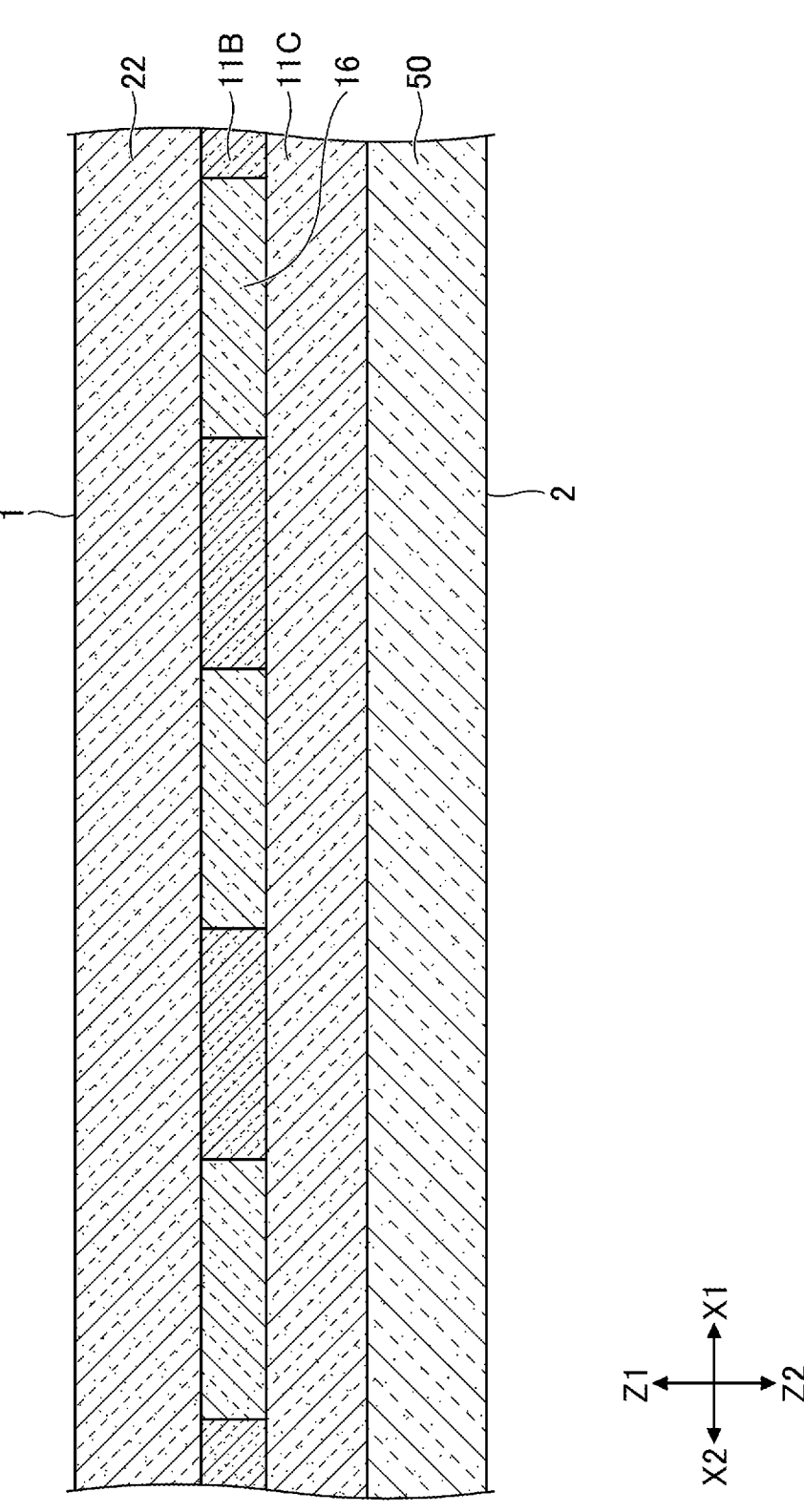
FIG. 14 is a cross-sectional view (third part) illustrating the method of manufacturing the silicon carbide semiconductor device according to the embodiment.
Figure 15:
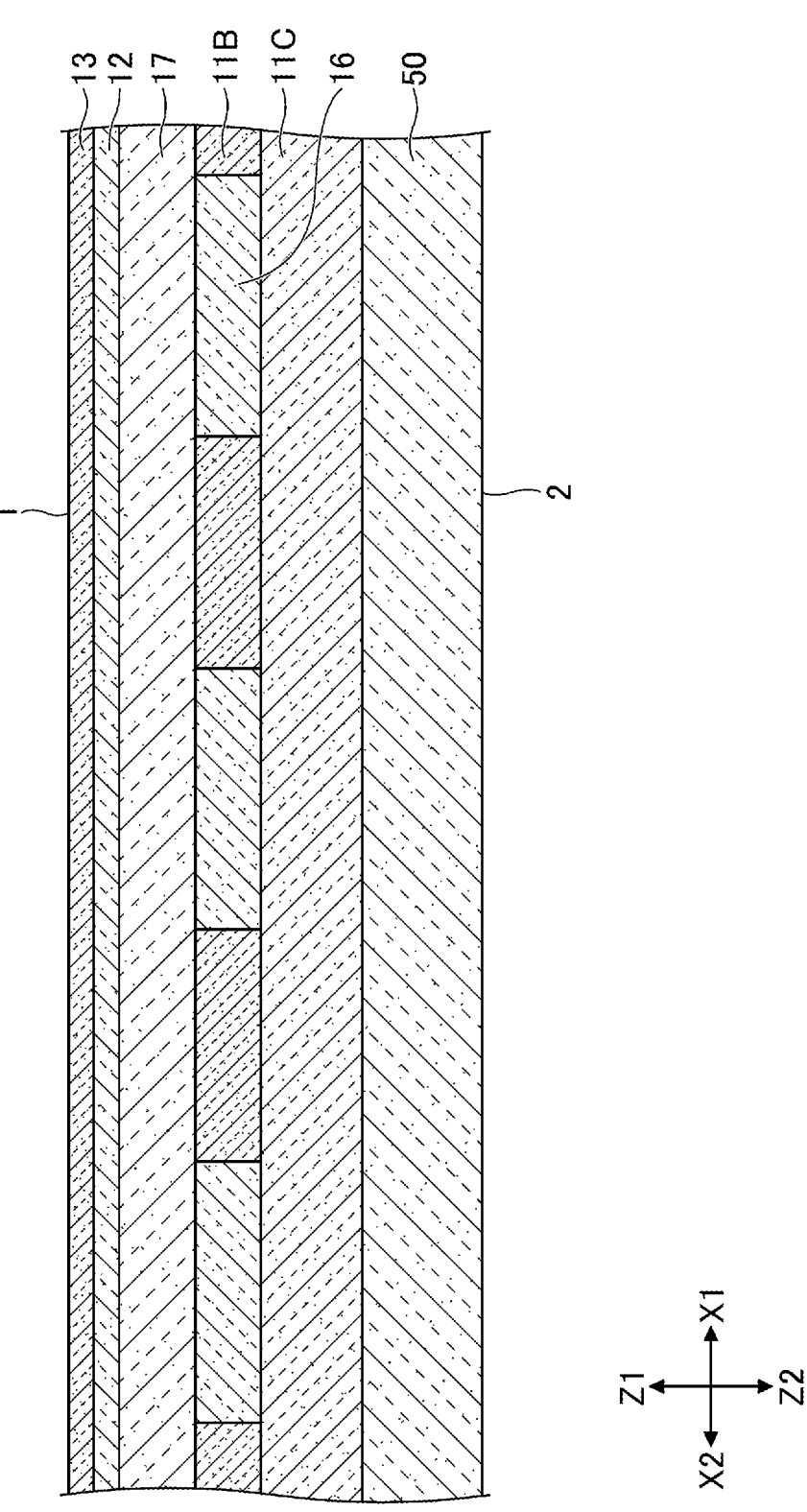
FIG. 15 is a cross-sectional view (fourth part) illustrating the method of manufacturing the silicon carbide semiconductor device according to the embodiment.

Next, as illustrated in FIG. 14, a second epitaxial layer 22 is formed. For example, the second epitaxial layer 22 is formed on the first epitaxial layer 21 by the CVD method using, for example, the mixed gas of silane and propane as the source gas and using hydrogen as the carrier gas.

During the epitaxial growth, an n type impurity such as nitrogen is implanted into the second epitaxial layer 22. The second epitaxial layer 22 has the n type conductivity.

Next, as illustrated in FIG. 15, the connection region 17 is formed. For example, a mask layer (not illustrated) having an opening is formed on a region where the connection region 17 is formed. P type impurity ions capable of imparting the p type conductivity, such as aluminum ions, are implanted into the second epitaxial layer 22. Thus, the connection region 17 is formed.

Figure 16:
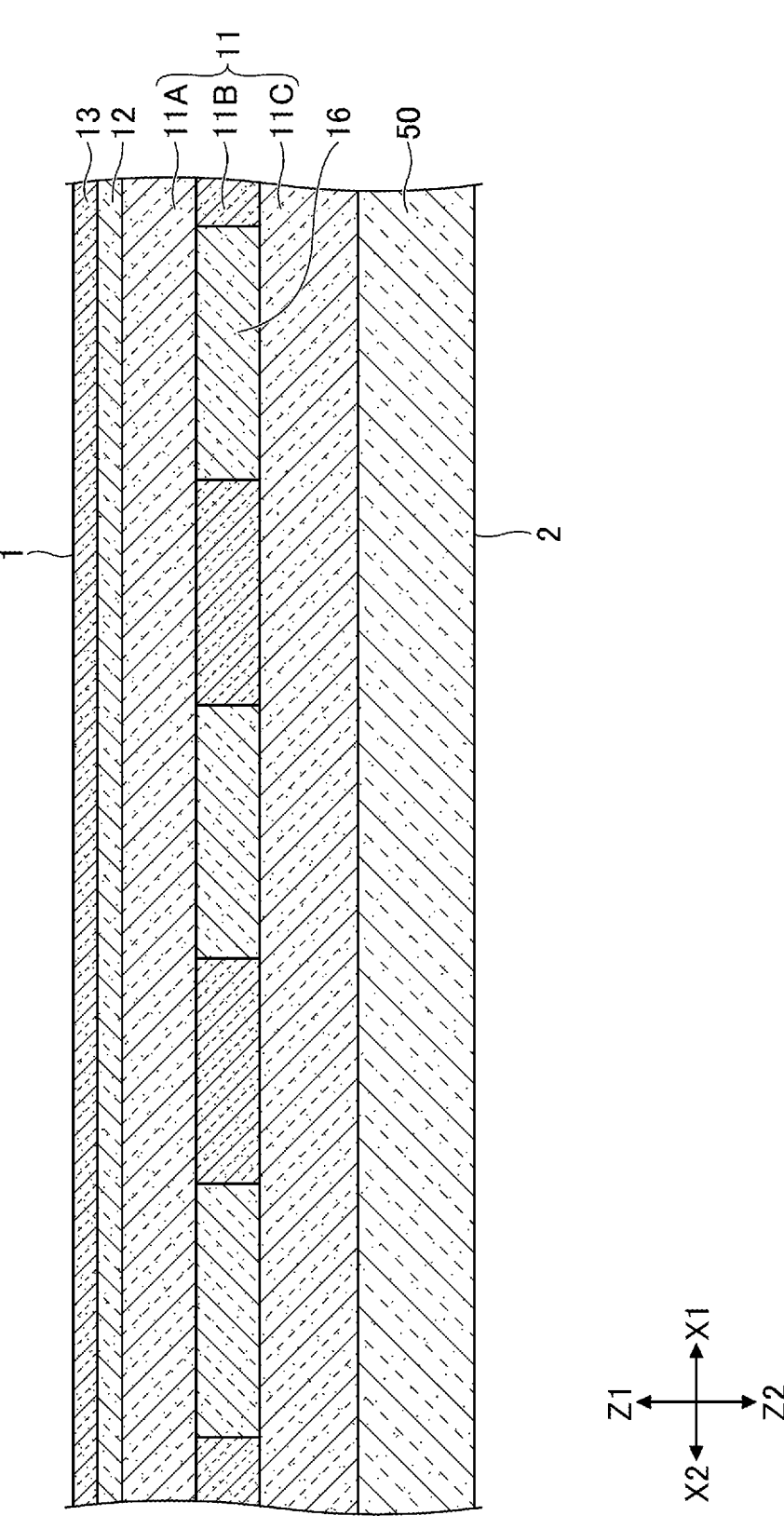
FIG. 16 is a cross-sectional view (fifth part) illustrating the method of manufacturing the silicon carbide semiconductor device according to the embodiment.
Figure 17:
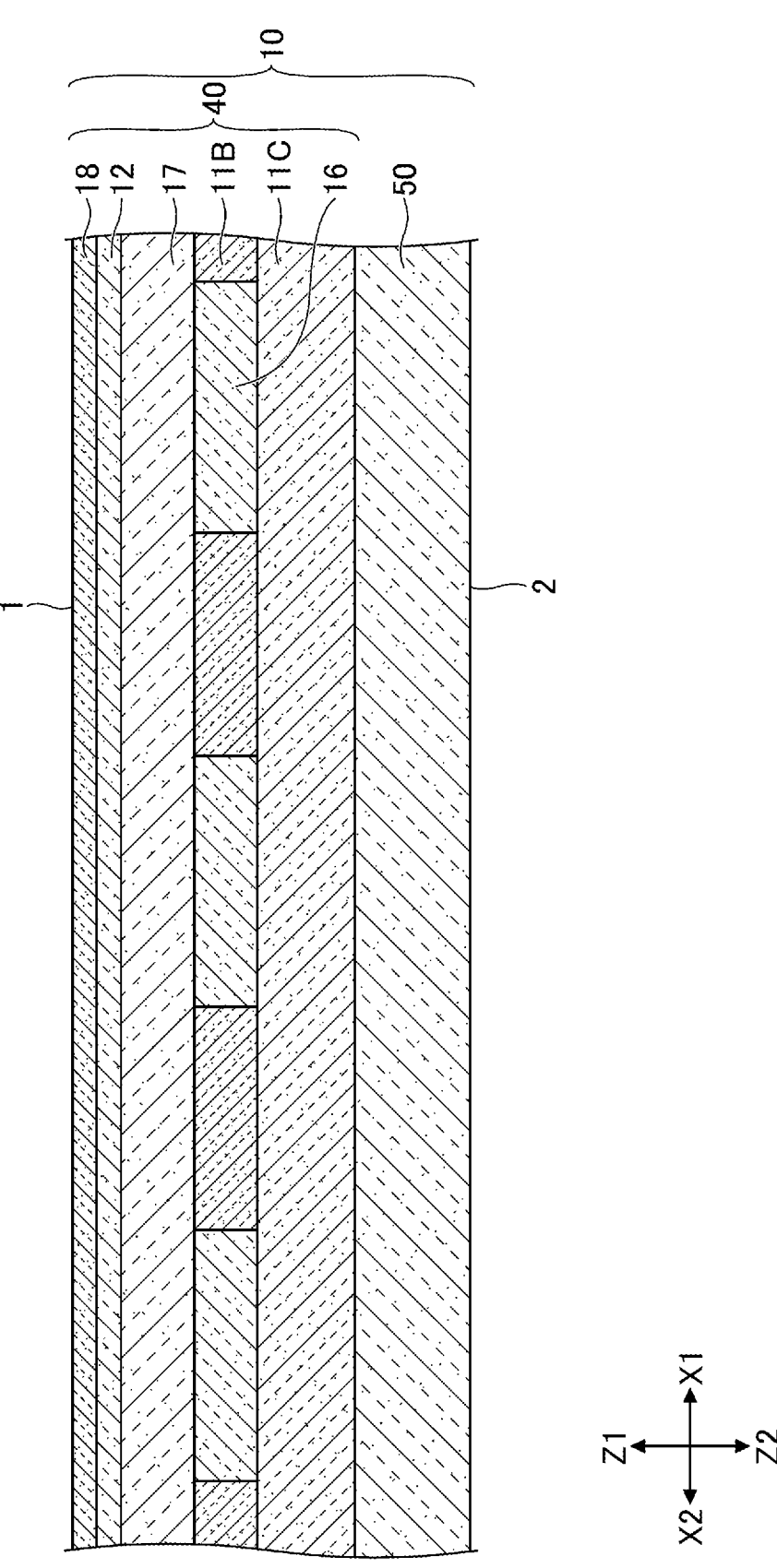
FIG. 17 is a cross-sectional view (sixth part) illustrating the method of manufacturing the silicon carbide semiconductor device according to the embodiment.

Next, as illustrated in FIG. 15 and FIG. 16, the body region 12 is formed. For example, p type impurity ions capable of imparting the p type conductivity, such as aluminum ions, are implanted into the entire surface of the second epitaxial layer 22. Thus, the body region 12 is formed. In the second epitaxial layer 22, a portion between adjacent connection regions 17 in the Y1-Y2 direction, at a position (on the Z2 side) closer to the silicon carbide single-crystal substrate 50 than the body region 12 is, forms the first region 11A.

Next, as also illustrated in FIG. 15 and FIG. 16, the source region 13 is formed. For example, n type impurity ions capable of imparting the n type conductivity, such as phosphorus, are implanted into the entire surface of the second epitaxial layer 22. Thus, the source region 13 is formed.

Next, as illustrated in FIG. 17, the contact region 18 is formed. For example, a mask layer (not illustrated) having an opening is formed on a region where the contact region 18 is formed. P type impurity ions capable of imparting the p type conductivity, such as aluminum ions, are implanted into the second epitaxial layer 22. Thus, the contact region 18 is formed.

Next, activation annealing is performed to activate the impurity ions implanted into the silicon carbide substrate 10. The activation annealing is performed at a temperature of preferably greater than or equal to 1500° C. and less than or equal to 1900° C., for example, at about 1700° C. The activation annealing is performed for a period of about 30 minutes, for example. The activation annealing is preferably performed in an inert gas atmosphere, for example, an Ar atmosphere.

Figure 18:
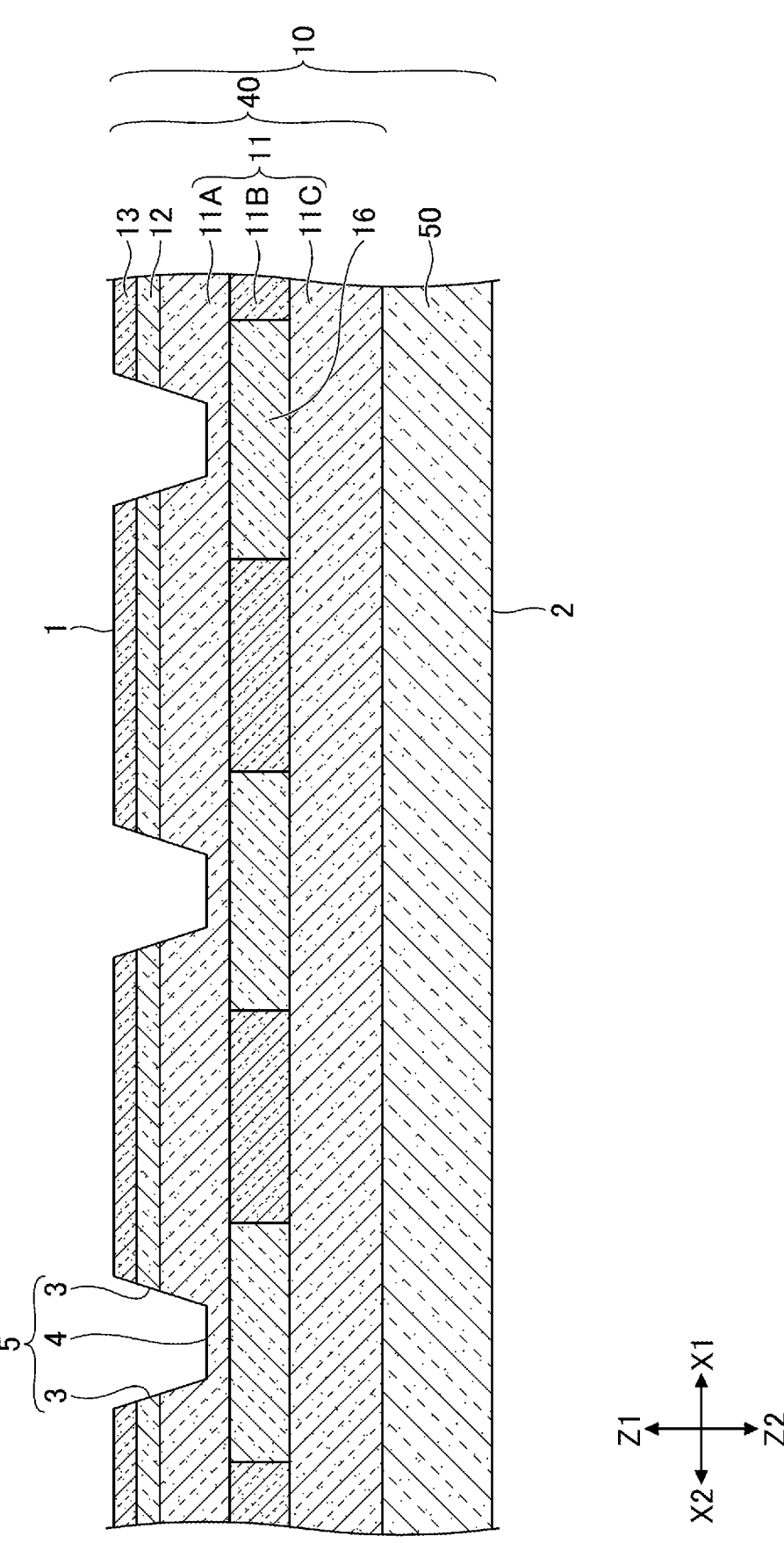
FIG. 18 is a cross-sectional view (seventh part) illustrating the method of manufacturing the silicon carbide semiconductor device according to the embodiment.

Next, as illustrated in FIG. 18, the gate trench 5 is formed. For example, a mask layer (not illustrated) having an opening at a position where the gate trench 5 is to be formed is formed on the first main surface 1 including the source region 13 and the contact region 18. The opening of the mask layer has a plan shape similar to the contour of the gate trench 5 in first main surface 1. The opening of the mask layer is slightly smaller than the contour of the gate trench 5 in the first main surface 1 and has a shape similar to that of the contour. The opening of the mask layer may be formed in an arc shape at the end portion. A portion of the source region 13, a portion of the body region 12, and a portion of the drift region 11 are removed by etching using the mask layer. As an etching method, for example, reactive ion etching, particularly inductively coupled plasma reactive ion etching can be used.

Specifically, for example, the inductively coupled plasma reactive ion etching can be used using sulfur hexafluoride ($SF_6$) or a mixed gas of $SF_6$ and oxygen ($O_2$) as a reactive gas. By the etching, a recessed portion (not illustrated) having side portions that are substantially perpendicular to the first main surface 1 and having a bottom portion that is provided continuously with the side portions and substantially parallel to the first main surface 1 is formed in a region where the gate trench 5 is to be formed.

Thermal etching is then performed in the recessed portion. The thermal etching can be performed by heating in an atmosphere containing a reactive gas having at least one kind of halogen atoms, for example, in a state where the mask layer is formed on the first main surface 1. The at least one kind of the halogen atoms includes at least one of a chlorine (Cl) atom and a fluorine (F) atom. The atmosphere contains, for example, chloride ($Cl_2$), boron trichloride $(BCl_3)$, $SF_6$ or tetrafluoromethane $(CF_4)$. For example, thermal etching is performed by using a mixed gas of a chlorine gas and an oxygen gas as a reaction gas and setting the heat treatment temperature to, for example, greater than or equal to 800° C. and less than or equal to 900° C. The reaction gas may contain a carrier gas in addition to the chlorine gas and the oxygen gas. As the carrier gas, for example, a nitrogen gas, an argon gas, a helium gas, or the like can be used.

By the thermal etching, the gate trench 5 is formed in the first main surface 1 of the silicon carbide substrate 10. The gate trench 5 is defined by the side surfaces 3 and the bottom surface 4. In a case where the opening as described above is formed on the mask layer, the side surfaces 3 are formed to have the first side surface 31, the second side surface 32, the third side surface 33, the fourth side surface 34, the fifth side surface 35, and the sixth side surface 36. The mask layer is then removed from the first main surface 1.

Figure 19:
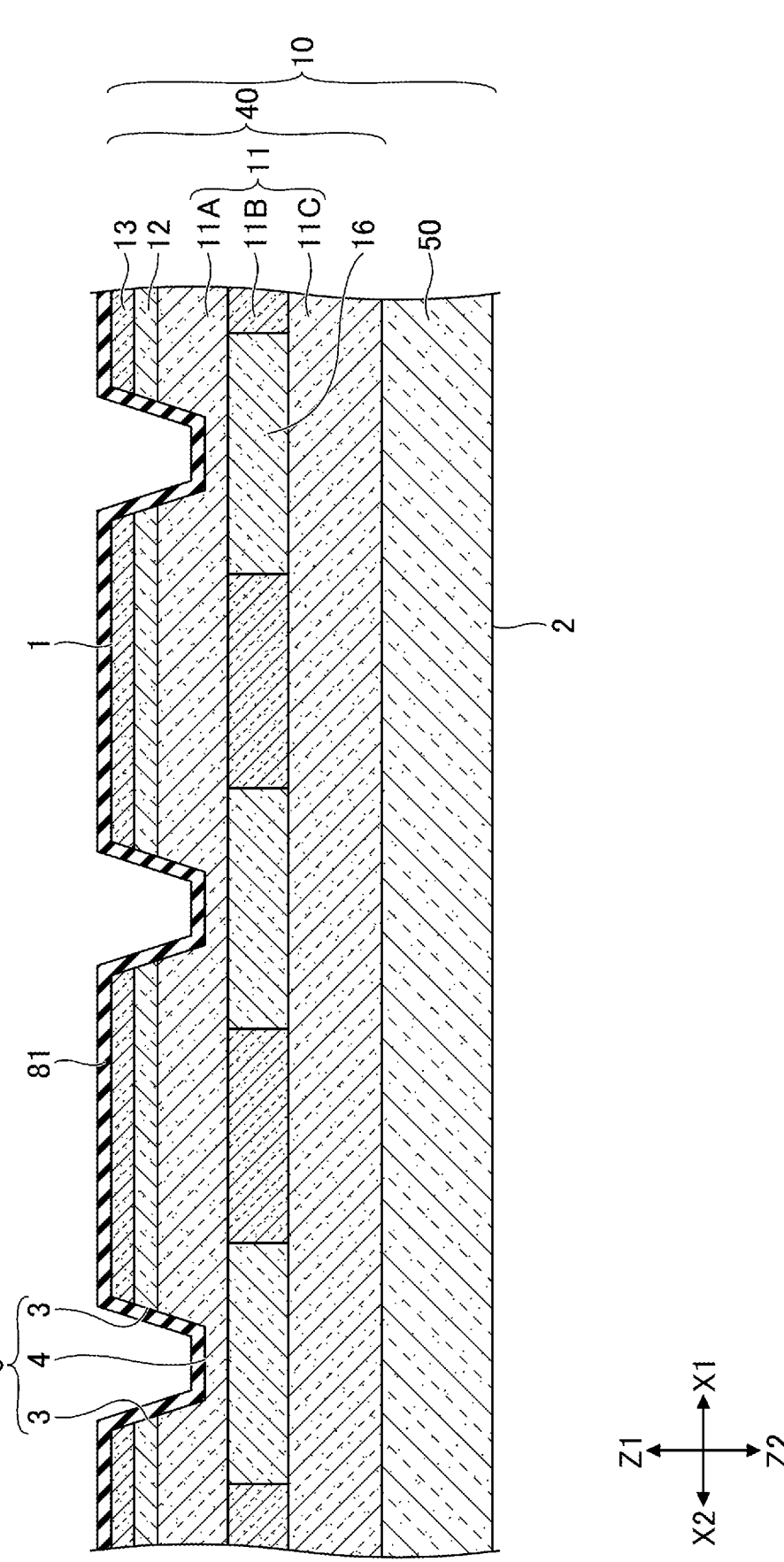
FIG. 19 is a cross-sectional view (eighth part) illustrating the method of manufacturing the silicon carbide semiconductor device according to the embodiment.

Next, as illustrated in FIG. 19, the gate insulating film 81 is formed. For example, by thermally oxidizing the silicon carbide substrate 10, the gate insulating film 81 in contact with the source region 13, the body region 12, the drift region 11, and the contact region 18 is formed. Specifically, the silicon carbide substrate 10 is heated at a temperature of, for example, greater than or equal to 1,300° C. and less than or equal to 1,400° C., in an atmosphere containing oxygen. Thus, the gate insulating film 81 is formed in contact with first main surface 1, the side surfaces 3, and the bottom surface 4. In a case where the gate insulating film 81 is formed by thermal oxidation, strictly speaking, a portion of the silicon carbide substrate 10 is brought into the gate insulating film 81. Therefore, in the subsequent processing, it is assumed that the first main surface 1, the side surfaces 3, and the bottom surface 4 have been slightly moved to the interface between the gate insulating film 81 and the silicon carbide substrate 10, after the thermal oxidation.

Next, heat treatment (NO annealing) may be performed on the silicon carbide substrate 10 in a nitrogen monoxide (NO) gas atmosphere. In the NO annealing, the silicon carbide substrate 10 is held for about one hour under the condition at a temperature of, for example, greater than or equal to 1,100° C. and less than or equal to 1,400° C. Thus, nitrogen atoms are implanted into the interface region between the gate insulating film 81 and the body region 12. As a result, formation of an interface state in the interface region is suppressed, and thus channel mobility can be improved.

Figure 20:
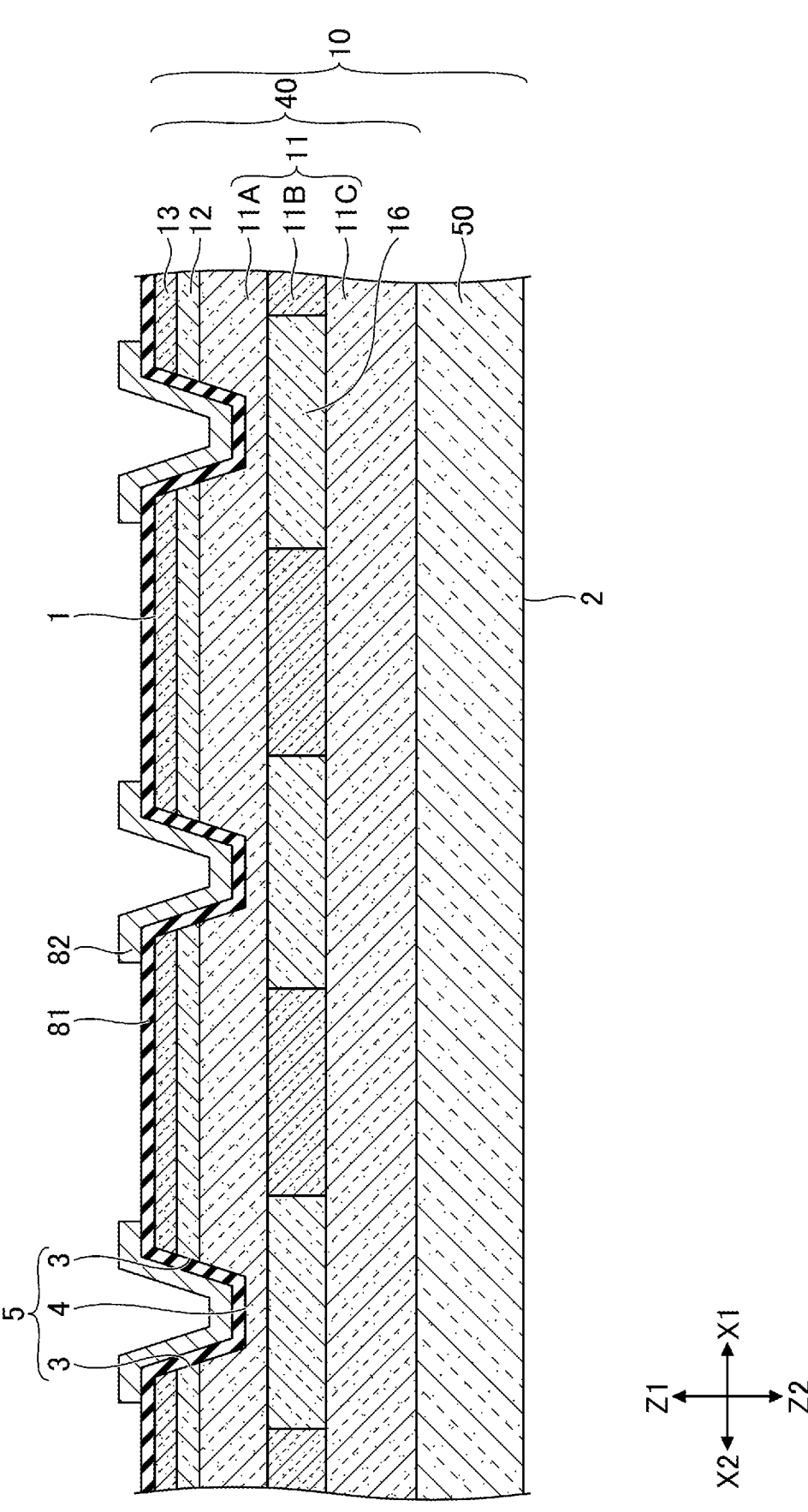
FIG. 20 is a cross-sectional view (ninth part) illustrating the method of manufacturing the silicon carbide semiconductor device according to the embodiment.

Next, as illustrated in FIG. 20, the gate electrode 82 is formed. The gate electrode 82 is formed on the gate insulating film 81. The gate electrode 82 is formed by, for example, a low pressure-chemical vapor deposition (LP-CVD) method. The gate electrode 82 is formed to face each of the source region 13, the body region 12, and the drift region 11.

Figure 21:
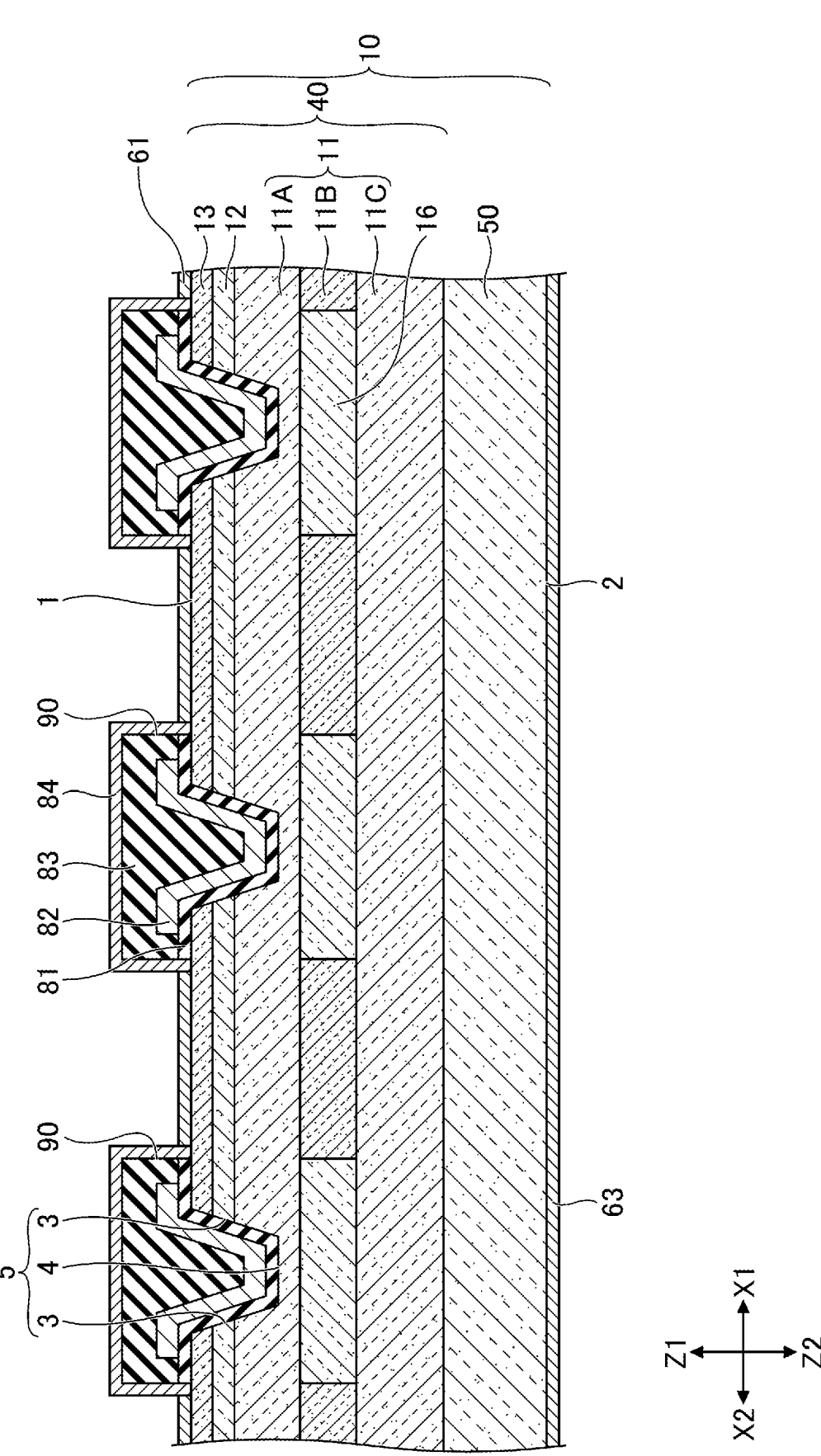
FIG. 21 is a cross-sectional view (tenth part) illustrating the method of manufacturing the silicon carbide semiconductor device according to the embodiment.

Next, as illustrated in FIG. 21, the interlayer insulating film 83 is formed. Specifically, the interlayer insulating film 83 is formed to cover the gate electrode 82 and to be in contact with the gate insulating film 81. The interlayer insulating film 83 is formed by, for example, the CVD method. The interlayer insulating film 83 is made of a material containing, for example, silicon dioxide. A portion of the interlayer insulating film 83 may be formed inside the gate trench 5.

Next, as illustrated in FIG. 21, the barrier metal film 84, the contact electrode 61, and the drain electrode 63 are formed. For example, the etching is performed so that the contact hole 90 is formed in the interlayer insulating film 83 and the gate insulating film 81, and thereby the source region 13 and the contact region 18 are exposed from the interlayer insulating film 83 and the gate insulating film 81 in the contact hole 90. The barrier metal film 84 is formed to cover the upper surface and the side surfaces of the interlayer insulating film 83 and the side surfaces of the gate insulating film 81. The barrier metal film 84 is made of a material containing, for example, titanium nitride. The barrier metal film 84 is formed by, for example, film formation by a sputtering method and reactive ion etching (RIE). A metal film (not illustrated) for the contact electrode 61 is then formed in contact with the portions of the source region 13 and the contact region 18 exposed from the contact hole 90 in the first main surface 1. The metal film for the contact electrode 61 is formed by, for example, the sputtering method. The metal film for the contact electrode 61 is made of a material containing nickel, for example. A metal film (not illustrated) for the drain electrode 63 is then formed in contact with the silicon carbide single-crystal substrate 50 at the second main surface 2. The metal film for the drain electrode 63 is formed by, for example, the sputtering method. The metal film for the drain electrode 63 is made of a material containing, for example, nickel.

Next, alloying annealing is performed. The metal film for the contact electrode 61 and the metal film for the drain electrode 63 are held at a temperature of, for example, greater than or equal to 900° C. and less than or equal to 1,100° C., for about 5 minutes. Thus, at least a portion of the metal film for the contact electrode 61 and at least a portion of the metal film for the drain electrode 63 react with silicon included in the silicon carbide substrate 10 to be silicided. Thus, the contact electrode 61 in ohmic contact with the source region 13 and the contact region 18, and the drain electrode 63 in ohmic contact with the silicon carbide single-crystal substrate 50 are formed. The contact electrode 61 may be made of a material containing titanium, aluminum, and silicon. The drain electrode 63 may be made of a material containing titanium, aluminum, and silicon.

Figure 22:
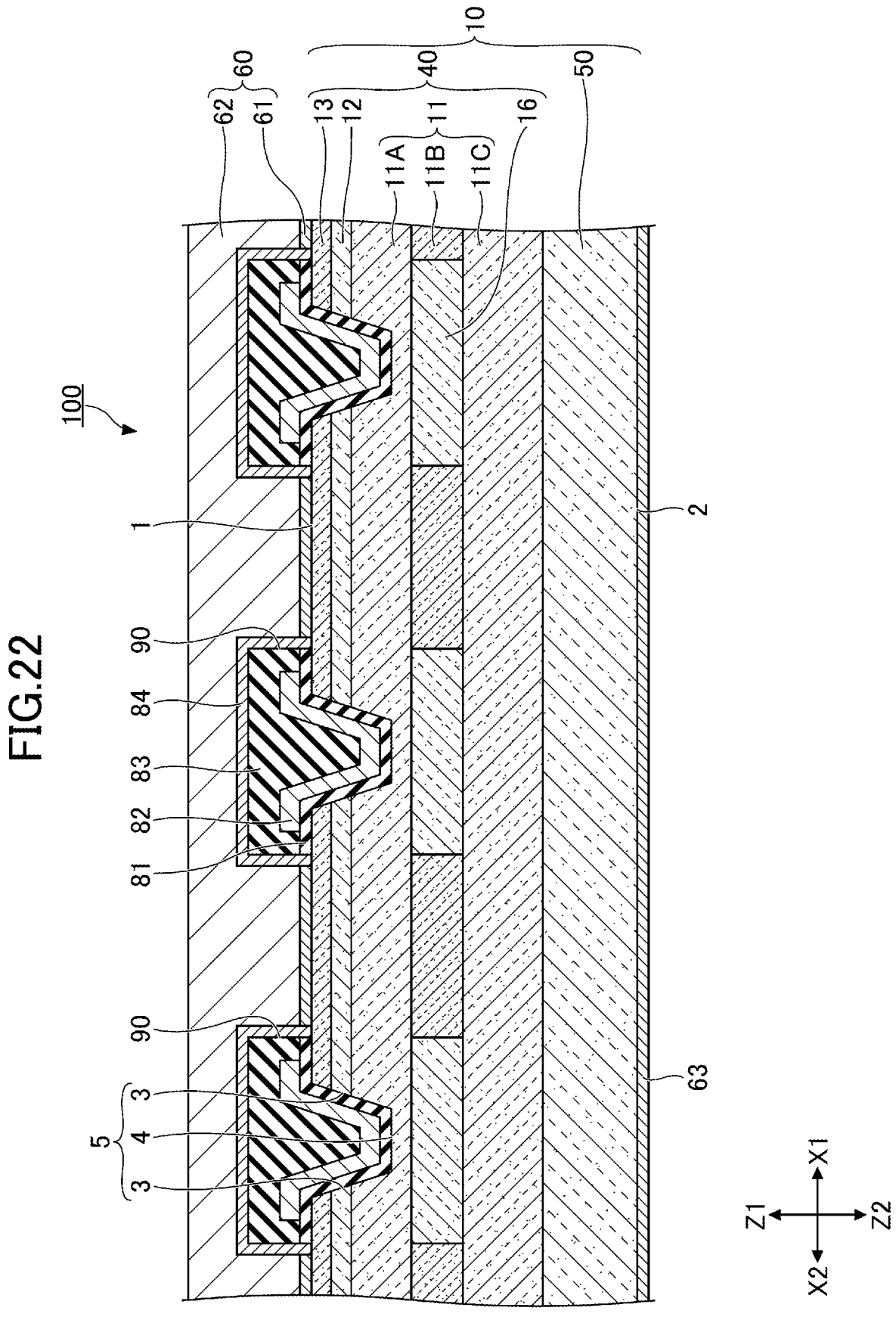
FIG. 22 is a cross-sectional view (eleventh part) illustrating the method of manufacturing the silicon carbide semiconductor device according to the embodiment.

Next, as illustrated in FIG. 22, the source wiring 62 is formed. Specifically, the source wiring 62 is formed to cover the contact electrode 61 and the barrier metal film 84. The source wiring 62 is formed by, for example, the film formation by the sputtering method and RIE. The source wiring 62 is made of, for example, a material containing aluminum. Thus, the source electrode 60 including the contact electrode 61 and the source wiring 62 is formed.

The MOSFET 100 according to the embodiment is manufactured as described above.

The operation and effect of the MOSFET 100 according to the present embodiment will now be described.

In the MOSFET 100 according to the present embodiment, the contour of the gate trench 5 in the first main surface 1 is curved along the third side surface 33 and the fourth side surface 34. With this arrangement, field concentration on the gate insulating film 81 near the boundary between the first main surface 1 and both the third side surface 33 and the fourth side surface 34 is alleviated, and thus the gate insulating film 81 can have excellent long-term reliability. Further, the contour of the gate trench 5 in the cross section parallel to the first main surface 1 has the first local minimum points 211, 311, and 411, the second local minimum points 212, 312, and 412, and the third local minimum points 213, 313, and 413. With this arrangement, the surfaces of the body region 12 exposed at the third side surface 33 and the fourth side surface 34 can have a property similar to that of a crystal plane in which excellent channel characteristics can easily be obtained. Therefore, excellent channel characteristics are obtained also on the third side surface 33 and the fourth side surface 34. For example, high channel mobility is obtained, and a gate threshold voltage is easily stabilized.

Similarly, in the MOSFET 100, the contour of the gate trench 5 in the first main surface 1 is curved along the fifth side surface 35 and the sixth side surface 36. With this arrangement, the field concentration on the gate insulating film 81 near the boundary between the first main surface 1 and both the fifth side surface 35 and the sixth side surface 36 is alleviated, and thus the gate insulating film 81 can have the excellent long-term reliability. Further, the contour of the gate trench 5 in the cross section parallel to the first main surface 1 has the fourth local minimum points 214, 314, and 414, the fifth local minimum points 215, 315, and 415, and the sixth local minimum points 216, 316, and 416. With this arrangement, the surfaces of the body region 12 exposed at the fifth side surface 35 and the sixth side surface 36 can have a property similar to that of a crystal plane in which excellent channel characteristics can easily be obtained. Therefore, excellent channel characteristics are obtained also on the fifth side surface 35 and the sixth side surface 36. For example, high channel mobility is obtained, and a gate threshold voltage is easily stabilized.

As described above, according to the present embodiment, both the channel characteristics and the long-term reliability of the gate insulating film can be achieved.

The third side surface 33 has the first flat surface 331 continuous with the bottom surface 4 and the first curved surface 332 continuous with both the first flat surface 331 and the first main surface 1, and the fourth side surface 34 has the second flat surface 341 continuous with the bottom surface 4 and the second curved surface 342 continuous with both the second flat surface 341 and the first main surface 1. The fifth side surface 35 has the third flat surface 351 continuous with the bottom surface 4 and the third curved surface 352 continuous with both the third flat surface 351 and the first main surface 1, and the sixth side surface 36 has the fourth flat surface 361 continuous with the bottom surface 4 and the fourth curved surface 362 continuous with both the fourth flat surface 361 and the first main surface 1. Therefore, the surfaces of the body region 12 exposed at the third side surface 33 and the fourth side surface 34 can easily have characteristics similar to that of a crystal plane in which excellent channel characteristics can easily be obtained.

Excellent channel characteristics can easily be obtained also on the third side surface 33 and the fourth side surface 34. Similarly, the surfaces of the body region 12 exposed at the fifth side surface 35 and the sixth side surface 36 can easily have characteristics similar to that of a crystal plane in which excellent channel characteristics can easily be obtained. Excellent channel characteristics can easily be obtained also on the fifth side surface 35 and the sixth side surface 36.

In particular, since the body region 12 is exposed at the first flat surface 331 and the second flat surface 341, more excellent channel characteristics can easily be obtained. Similarly, since the body region 12 is exposed at the third flat surface 351 and the fourth flat surface 361, more excellent channel characteristics can easily be obtained.

In a case where each of the distance between the first local minimum point and the third local minimum point and the distance between the second local minimum point and the third local minimum point decreases as the cross section parallel to the first main surface 1 approaches the bottom surface 4, the surfaces of the body region 12 exposed at the third side surface 33 and the fourth side surface 34 can easily have characteristics similar to that of a crystal plane in which excellent channel characteristics can easily be obtained. Therefore, excellent channel characteristics can easily be obtained also on the third side surface 33 and the fourth side surface 34. Similarly, in a case where the distance between the fourth local minimum point and the sixth local minimum point and the distance between the fifth local minimum point and the sixth local minimum point decrease as the cross section parallel to the first main surface 1 approaches the bottom surface 4, the surfaces of the body region 12 exposed at the fifth side surface 35 and the sixth side surface 36 can easily have characteristics similar to that of a crystal plane in which excellent channel characteristics can easily be obtained. Therefore, excellent channel characteristics can easily be obtained also on the fifth side surface 35 and the sixth side surface 36.

In a case where the radius of curvature at the third local minimum point between the first curved surface 332 and the second curved surface 342 decreases as the cross section parallel to the first main surface 1 approaches the bottom surface 4, the surfaces of the body region 12 exposed at the third side surface 33 and the fourth side surface 34 can easily have characteristics similar to that of a crystal plane in which excellent channel characteristics can easily be obtained. Therefore, excellent channel characteristics can easily be obtained also on the third side surface 33 and the fourth side surface 34. Similarly, in a case where the radius of curvature at the sixth local minimum point between the third curved surface 352 and the fourth curved surface 362 decreases as the cross section parallel to the first main surface 1 approaches the bottom surface 4, the surfaces of the body region 12 exposed at the fifth side surface 35 and the sixth side surface 36 can easily have characteristics similar to that of a crystal plane in which excellent channel characteristics can easily be obtained. Therefore, excellent channel characteristics can easily be obtained also on the fifth side surface 35 and the sixth side surface 36.

In a case where the radius of curvature at the first maximum point 221 and the radius of curvature at the second maximum point 222 increase as the cross section parallel to the first main surface 1 approaches the bottom surface 4, the surfaces of the body region 12 exposed at the third side surface 33 and the fourth side surface 34 can easily have characteristics similar to that of a crystal plane in which excellent channel characteristics can easily be obtained. Therefore, excellent channel characteristics can easily be obtained also on the third side surface 33 and the fourth side surface 34. Similarly, in a case where the radius of curvature at the third maximum point 223 and the radius of curvature at the fourth maximum point 224 increase as the cross section parallel to the first main surface 1 approaches the bottom surface 4, the surfaces of the body region 12 exposed at the fifth side surface 35 and the sixth side surface 36 can easily have characteristics similar to that of a crystal plane in which excellent channel characteristics can easily be obtained. Therefore, excellent channel characteristics can easily be obtained also on the fifth side surface 35 and the sixth side surface 36.

The thickness of the gate insulating film 81 on the first flat surface 331, with respect to the first flat surface 331, is preferably smaller than the thickness of the gate insulating film 81 on the first curved surface 332, with respect to the first curved surface 332. This is to facilitate the control of the channel of the body region 12 exposed at the third side surface 33. The thickness of the gate insulating film 81 on the second flat surface 341, with respect to the second flat surface 341, is preferably smaller than the thickness of the gate insulating film 81 on the second curved surface 342, with respect to the second curved surface 342. This is to facilitate the control of the channel of the body region 12 exposed at the fourth side surface 34. The thickness of the gate insulating film 81 on the third flat surface 351, with respect to the third flat surface 351, is preferably smaller than the thickness of the gate insulating film 81 on the third curved surface 352, with respect to the third curved surface 352. This is to facilitate the control of the channel of the body region 12 exposed at the fifth side surface 35. The thickness of the gate insulating film 81 on the fourth flat surface 361, with respect to the fourth flat surface 361, is preferably smaller than the thickness of the gate insulating film 81 on the fourth curved surface 362, with respect to the fourth curved surface 362. This is to facilitate the control of the channel of the body region 12 exposed at the sixth side surface 36.

In a case where the third side surface 33 has a region having an inclination angle of greater than or equal to 25° and less than or equal to 45°, with respect to the normal direction of the first main surface 1, the surface of the body region 12 exposed at the third side surface 33 can easily have characteristics similar to that of a crystal plane in which excellent channel characteristics can easily be obtained. Therefore, excellent channel characteristics can easily be obtained also on the third side surface 33. In a case where the fourth side surface 34 has a region having an inclination angle of greater than or equal to 25° and less than or equal to 45°, with respect to the normal direction of the first main surface 1, the surface of the body region 12 exposed at the fourth side surface 34 can easily have characteristics similar to that of a crystal plane in which excellent channel characteristics can easily be obtained. Therefore, excellent channel characteristics can easily be obtained also on the fourth side surface 34. In particular, in a case where the body region 12 is exposed at the regions each having the inclination angle in the specified range, more favorable channel characteristics can easily be obtained.

In a case where the fifth side surface 35 has a region having an inclination angle of greater than or equal to 25° and less than or equal to 45°, with respect to the normal direction of the first main surface 1, the surface of the body region 12 exposed at the fifth side surface 35 can easily have characteristics similar to that of a crystal plane in which excellent channel characteristics can easily be obtained. Therefore, excellent channel characteristics can easily be obtained also on the fifth side surface 35. In a case where the sixth side surface 36 has a region having an inclination angle of greater than or equal to 25° and less than or equal to 45°, with respect to the normal direction of the first main surface 1, the surface of the body region 12 exposed at the sixth side surface 36 can easily have characteristics similar to that of a crystal plane in which excellent channel characteristics can easily be obtained. Therefore, excellent channel characteristics can easily be obtained also on the sixth side surface 36. In particular, in a case where the body region 12 is exposed at the regions each having the inclination angle in the specified range, more favorable channel characteristics can easily be obtained.

Although the embodiments of the present disclosure have been described in detail, the present disclosure is not limited to one or more specific embodiments, and various modifications and changes can be made within the scope set forth in the claims.

DESCRIPTION OF THE REFERENCE
NUMERALS 1 first main surface
2 second main surface 3 side surface
4 bottom surface
5 gate trench
10 silicon carbide substrate
11 drift region
11A first region
11B second region
11C third region
12 body region
13 source region
16 field relief region
17 connection region
18 contact region
21 first epitaxial layer
22 second epitaxial layer
31 first side surface
32 second side surface
33 third side surface
34 fourth side surface
35 fifth side surface
36 sixth side surface
40 silicon carbide epitaxial layer
50 silicon carbide single-crystal substrate
60 source electrode
61 contact electrode
62 source wiring
63 drain electrode
81 gate insulating film
82 gate electrode
83 interlayer insulating film
84 barrier metal film
90 contact hole
100 MOSFET
200, 300, 400 contour
211, 311, 411 first local minimum point
212, 312, 412 second local minimum point
213, 313, 413 third local minimum point
214, 314, 414 fourth local minimum point
215, 315, 415 fifth local minimum point
216, 316, 416 sixth local minimum point
221 first maximum point
222 second maximum point
223 third maximum point
224 fourth maximum point
331 first flat surface
332 first curved surface
341 second flat surface
342 second curved surface
351 third flat surface
352 third curved surface
361 fourth flat surface
362 fourth curved surface

The invention claimed is:

1. A silicon carbide semiconductor device comprising:
a silicon carbide substrate having a first main surface, the silicon carbide substrate including
a drift region having a first type conductivity,
a body region having a second type conductivity different from the first type conductivity, the body region being provided on the drift region, and
a source region having the first type conductivity, the source region being provided on the body region so as to be separated from the drift region,
wherein the first main surface is provided with a gate trench defined by (i) side surfaces penetrating both the source region and the body region to reach the drift region and (ii) a bottom surface continuous with the side surfaces, the gate trench being extended in a first direction parallel to the first main surface, and a gate insulating film in contact with the side surfaces, the bottom surface, and the first main surface is further provided, wherein the side surfaces include a first side surface extending in the first direction, a second side surface extending in the first direction, the second side surface being away from the first side surface in a second direction that is parallel to the first main surface and perpendicular to the first direction, a third side surface continuous with the first side surface, and a fourth side surface continuous with the second side surface and the third side surface, wherein a contour of the gate trench on the first main surface is curved along the third side surface and the fourth side surface, and wherein a contour of the gate trench in a cross section parallel to the first main surface includes a first local minimum point at which a radius of curvature is a local minimum at a boundary between the first side surface and the third side surface, a second local minimum point at which a radius of curvature is a local minimum at a boundary between the second side surface and the fourth side surface, and a third local minimum point at which a radius of curvature is a local minimum at a boundary between the third side surface and the fourth side surface.

2. The silicon carbide semiconductor device according to claim 1, wherein a distance between the first local minimum point and the third local minimum point and a distance between the second local minimum point and the third local minimum point decrease as the cross section approaches the bottom surface.

3. The silicon carbide semiconductor device according to claim 1, wherein the third side surface includes a first flat surface continuous with the bottom surface, and a first curved surface continuous with the first flat surface and the first main surface, and wherein the fourth side surface includes a second flat surface continuous with the bottom surface, and a second curved surface continuous with the second flat surface and the first main surface.

4. The silicon carbide semiconductor device according to claim 3, wherein the body region is exposed at the first flat surface and the second flat surface.

5. The silicon carbide semiconductor device according to claim 3, wherein the radius of curvature at the third local minimum point between the first curved surface and the second curved surface decreases as the cross section approaches the bottom surface.

6. The silicon carbide semiconductor device according to claim 3, wherein the contour of the gate trench in the cross section parallel to the first main surface includes a first maximum point at which a radius of curvature is maximum on the first curved surface, and a second maximum point at which a radius of curvature is maximum on the second curved surface, and wherein the radius of curvature at the first maximum point and the radius of curvature at the second maximum point increase as the cross section approaches the bottom surface.

7. The silicon carbide semiconductor device according to claim 3, wherein a thickness of the gate insulating film on the first flat surface, with respect to the first flat surface, is smaller than a thickness of the gate insulating film on the first curved surface, with respect to the first curved surface, and wherein a thickness of the gate insulating film on the second flat surface, with respect to the second flat surface, is smaller than a thickness of the gate insulating film on the second curved surface, with respect to the second curved surface.

8. The silicon carbide semiconductor device according to claim 1, wherein the third side surface includes a first region having an inclination angle of greater than or equal to 25° and less than or equal to 45°, with respect to a normal direction of the first main surface, and wherein the fourth side surface includes a second region having the inclination angle of greater than or equal to 25° and less than or equal to 45°, with respect to the normal direction of the first main surface.

9. The silicon carbide semiconductor device according to claim 8, wherein the body region is exposed at the first region and the second region.

\* \* \* \* \*